United States Patent [19]

Williams

[11] 4,132,059

[45] Jan. 2, 1979

[54] STACKED LOGIC DESIGN FOR I²L WATCH

[75] Inventor: Clark R. Williams, Plano, Tex.

[73] Assignee: Texas Instruments Incorporated, Dallas, Tex.

[21] Appl. No.: 758,513

[22] Filed: Jan. 11, 1977

Related U.S. Application Data

[62] Division of Ser. No. 443,535, Feb. 19, 1974, Pat. No. 4,013,901.

[51] Int. Cl.² .................. G04C 3/00; H03K 1/02; H03K 19/08
[52] U.S. Cl. .................. 58/23 A; 58/57; 307/296 R; 307/213; 357/40; 357/44
[58] Field of Search .............. 58/23 R, 23 A, 57; 307/296, 213, 303, 313; 357/40, 44

[56] References Cited

U.S. PATENT DOCUMENTS

| | | | |
|---|---|---|---|
| 3,119,935 | 1/1964 | Samusenko | 307/318 |
| 3,446,989 | 5/1969 | Allen et al. | 307/291 X |
| 3,699,763 | 10/1972 | Zeph | 58/23 R |

*Primary Examiner*—Edith S. Jackmon
*Attorney, Agent, or Firm*—Stephen S. Sadacca; Rene' Grossman

[57] ABSTRACT

An electronic timekeeping system is implemented in bipolar integrated circuit technology for displaying time by way of a digital display. The bipolar circuitry is implemented utilizing integrated injection logic and is interconnected with a plurality of circuit elements connected in parallel in levels such that the levels are electrically stacked and serially diode coupled.

11 Claims, 34 Drawing Figures

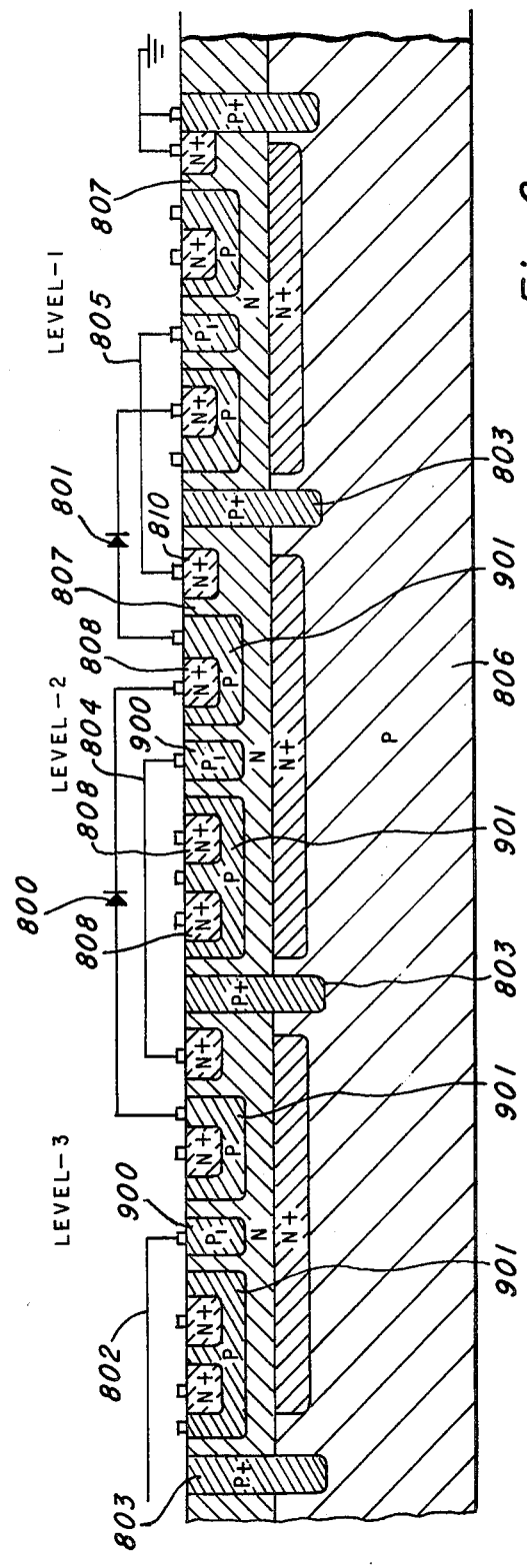

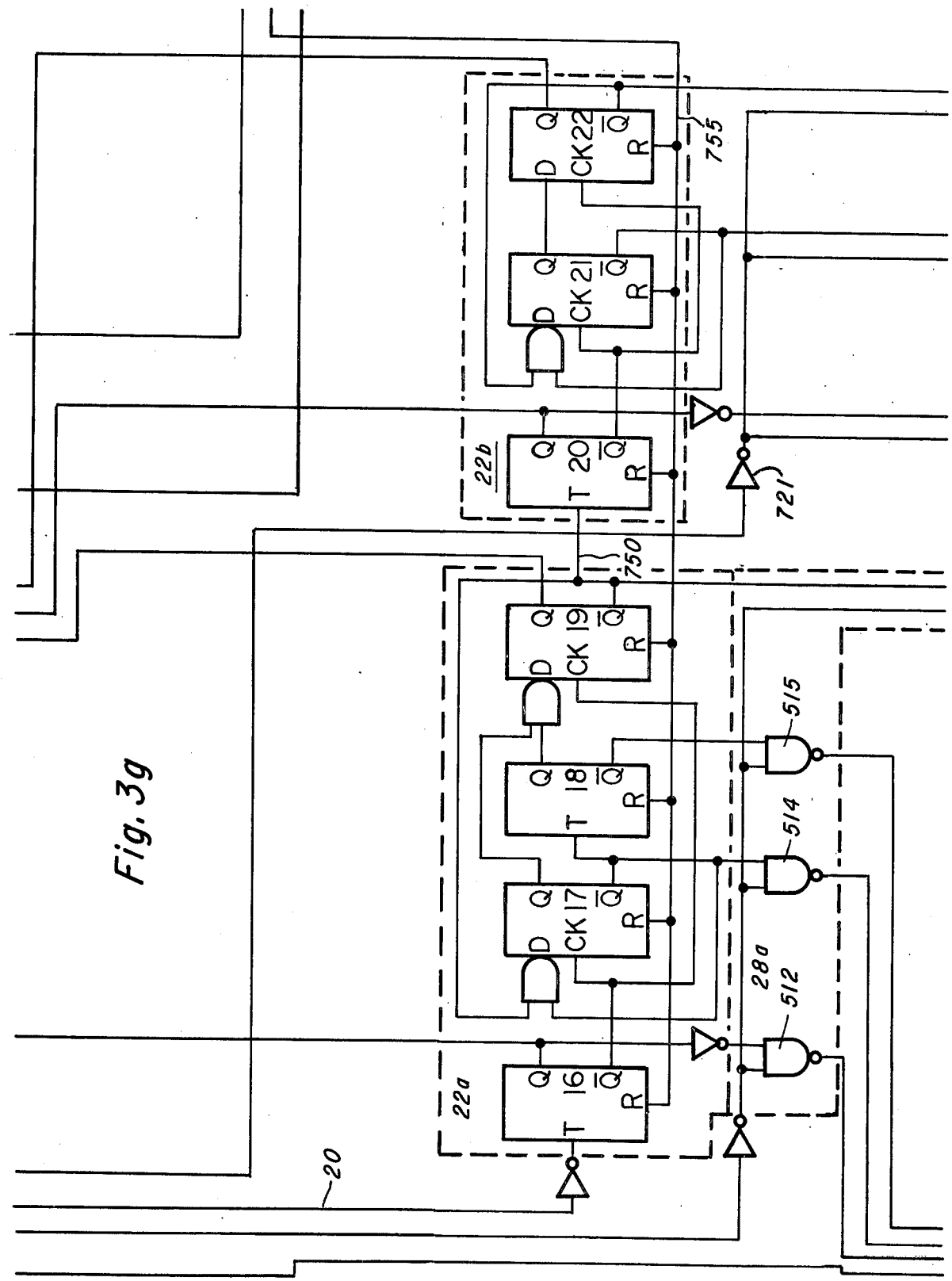

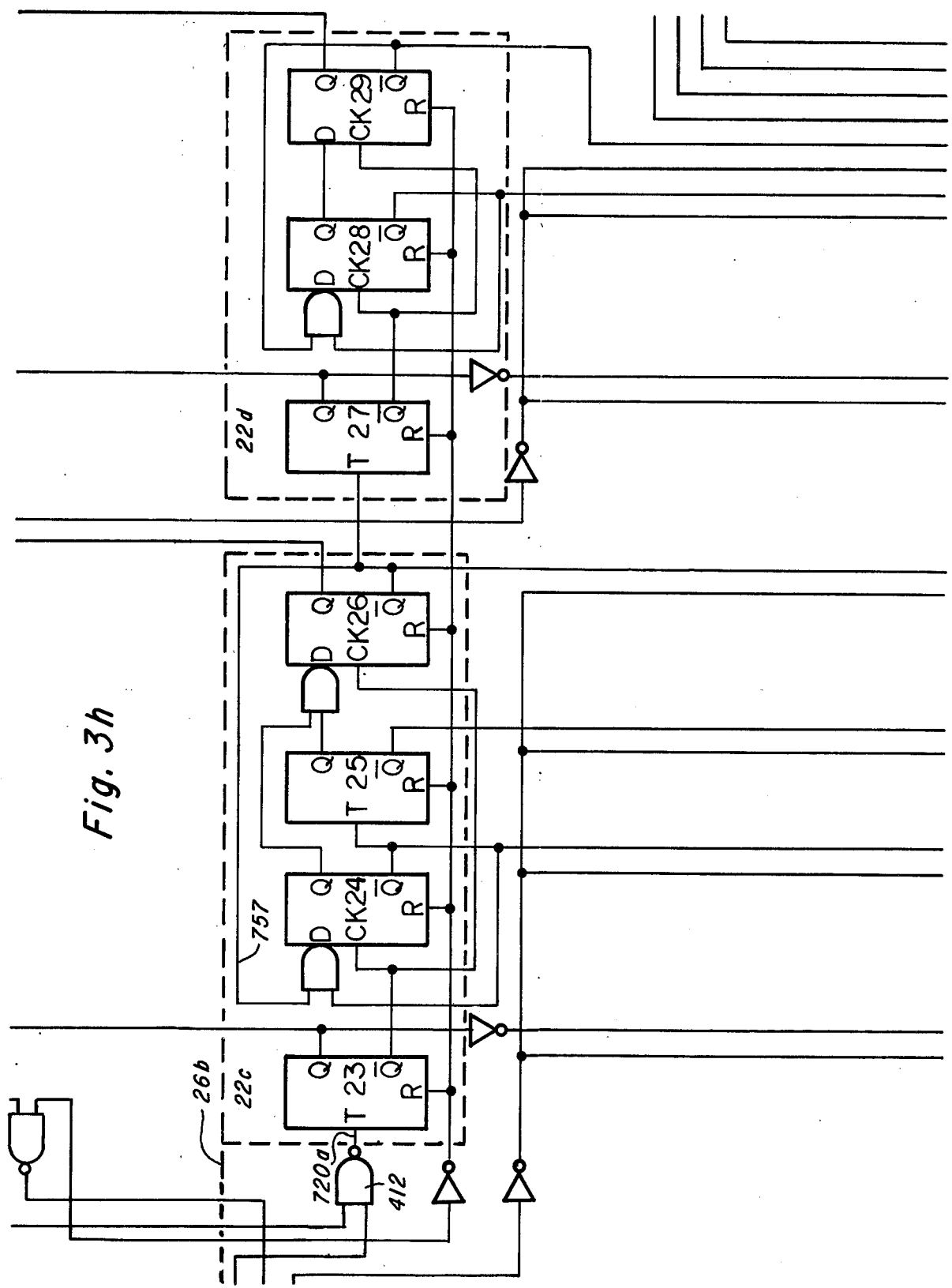

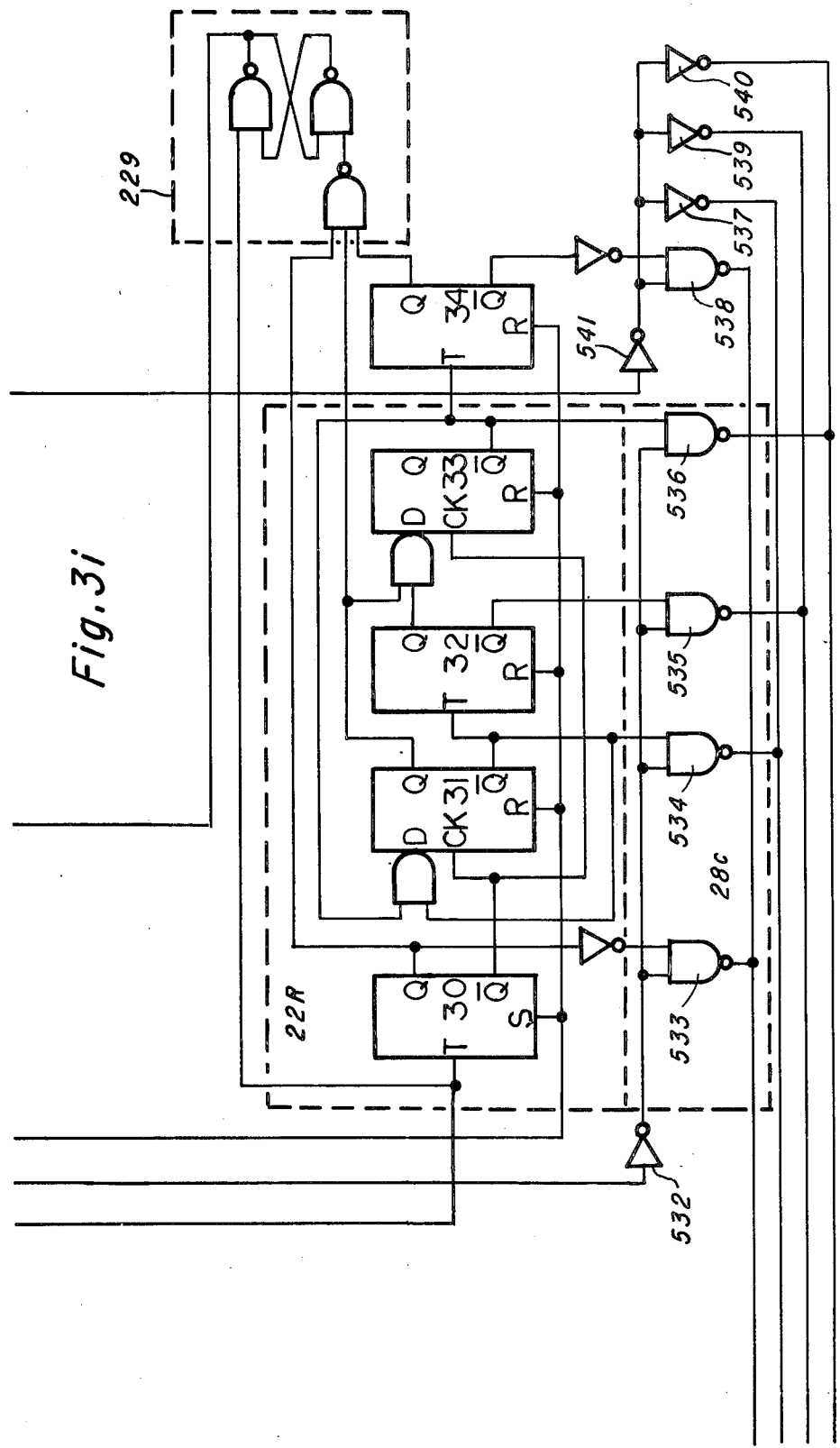

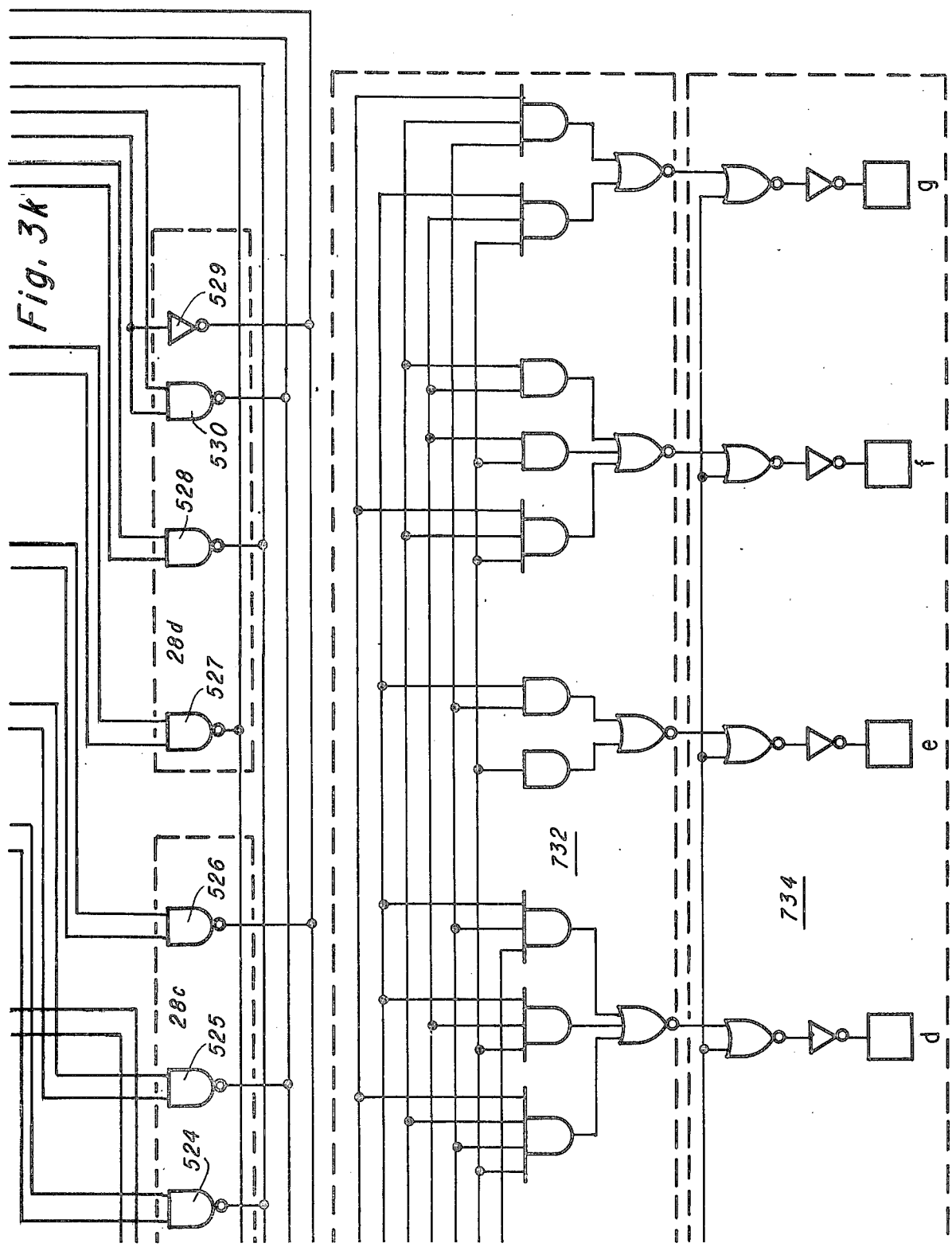

| Fig.3c | Fig.3e | Fig.3f | Fig.3i | Fig.3l |
|---|---|---|---|---|
| | | Fig.3h | Fig.3k | |
| Fig.3b | Fig.3d | Fig.3g | Fig.3j | |
| Fig.3a | | | | |

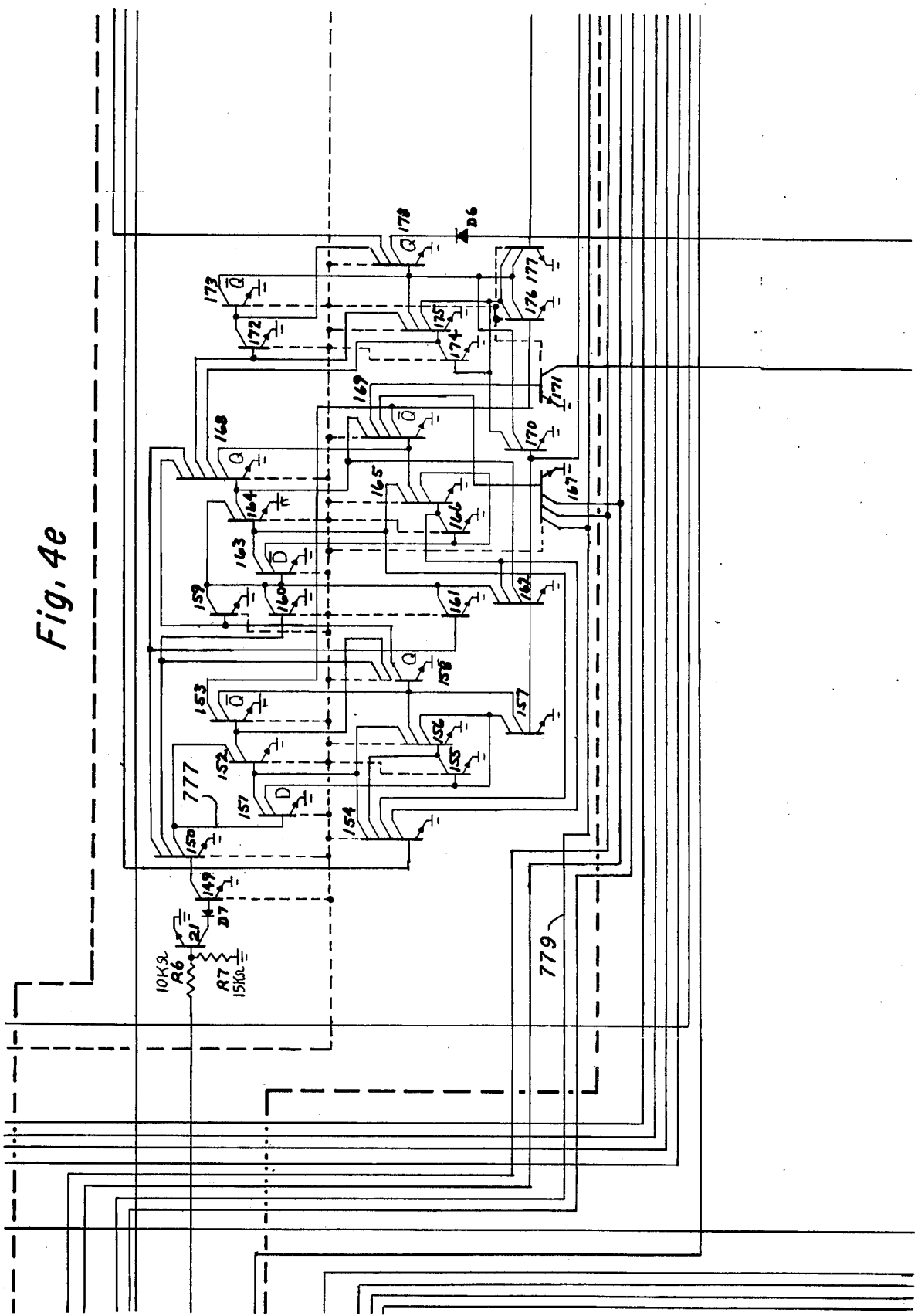

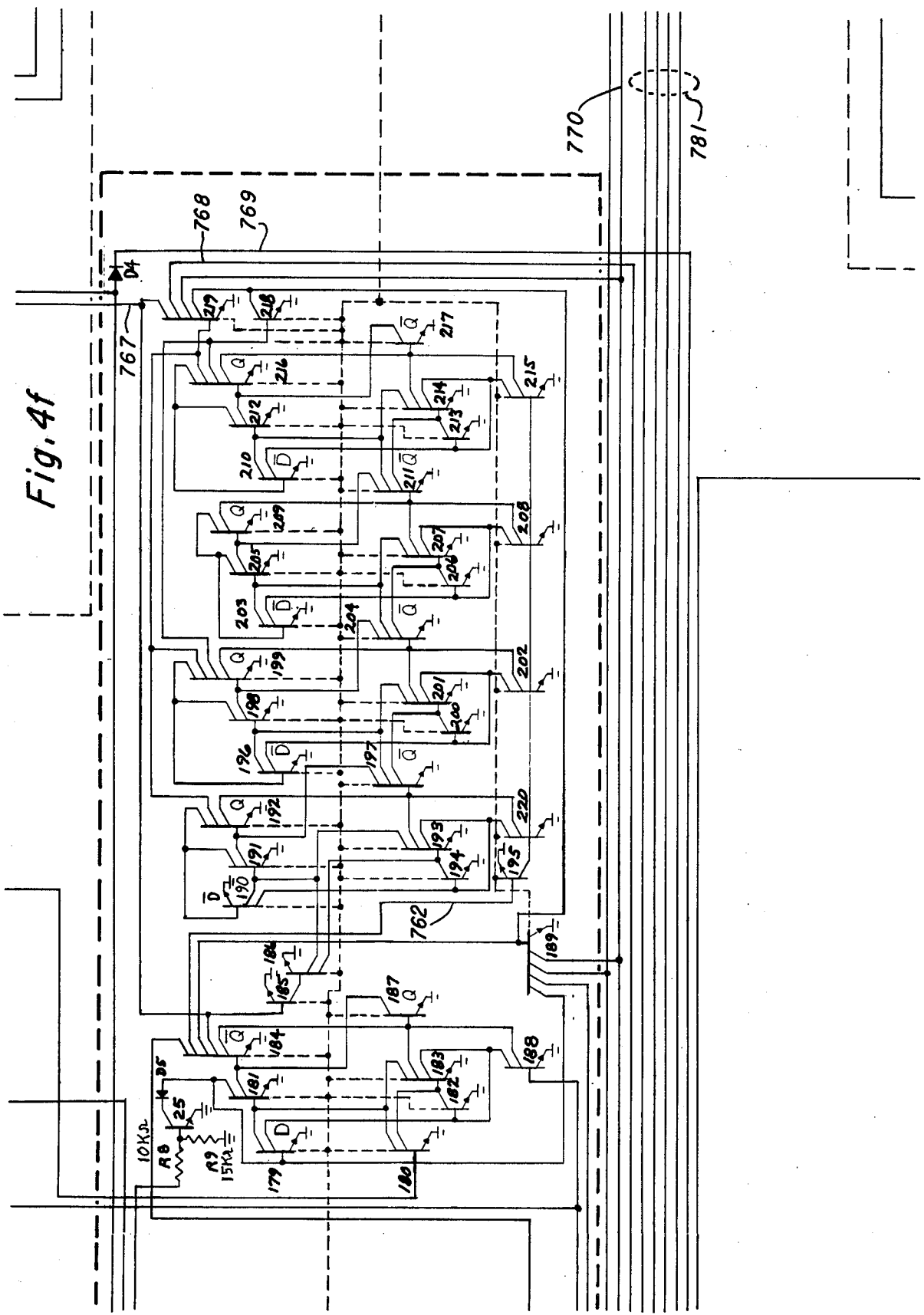

| Fig. 4a | Fig. 4b | Fig. 4c | |
|---|---|---|---|
| | | Fig. 4g | |
| Fig. 4d | Fig. 4e | Fig. 4f | |
| Fig. 4h | Fig. 4i | Fig. 4j | Fig. 4k |

Fig. 4L

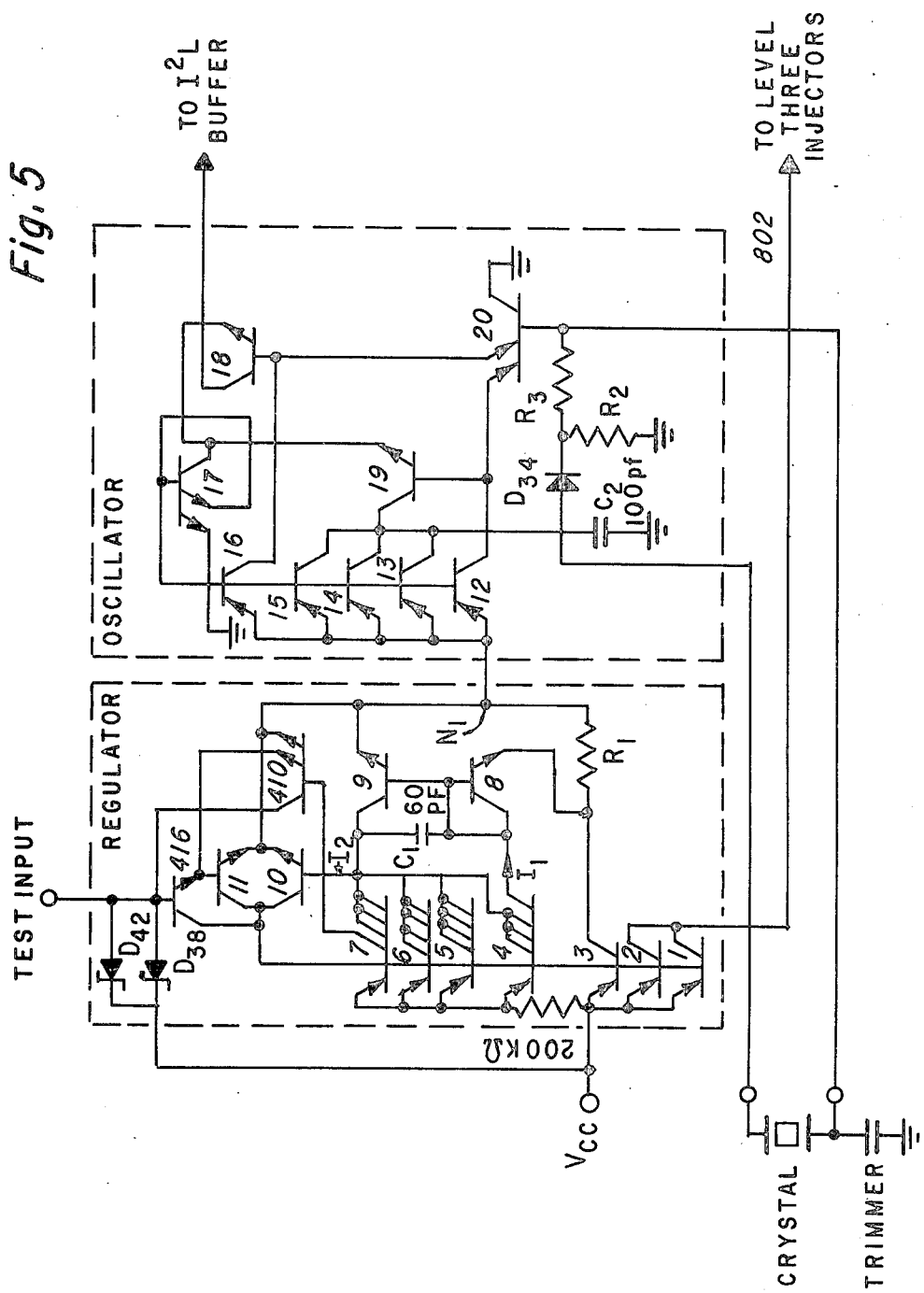

STACKED LOGIC DESIGN FOR I²L WATCH

This is a division, of application Ser. No. 443,535, filed Feb. 19, 1974, which is now U.S. Pat. No. 4,013,901.

The present invention relates to electronic timekeeping devices in general and more particularly to the bipolar integrated injection logic implementation thereof.

Digital electronic timekeeping devices of sufficiently low power dissipation so as to allow application in a wristwatch have been described extensively in the literature. Complementary metal oxide semiconductor circuitry has been proposed utilizing asynchronous counters driving other asynchronous counters and is commercially available in the market place for actuating both VLED and liquid crystal type digital displays. Furthermore, bipolar electronic circuitry of the low power dissipation type and having synchronous counters has been proposed such as in copending patent application, "Electronic Timekeeping System", Ser. No. 264,212, filed June 19, 1972, by Williams et al.

Problems inherent in providing a digital wristwatch have been defined and are well known. For example, the watch circuitry must be configured so as to minimize power drain so as to maximize life of the watch battery. Furthermore, a technology must be utilized which lends itself readily to integrated circuit application, thereby requiring parameters and limitations suitable to the integration process. For example, process parameters must be well controlled and reproducible, and device geometries must be such so as to maximize device density in the integrated circuit chip. Still further, if a relatively new technology is utilized in the integrated circuit process, conventional logic and functional circuits must be redesigned to implement the function most efficiently.

Low power, high circuit density bipolar integrated circuit concepts have been proposed utilizing the recently disclosed integrated injection logic (I²L). See, for example, U.S. Pat. No. 3,736,477 which defines in detail the semiconductor structure of integrated injection logic wherein a lateral PNP transistor is utilized as an injector to an inversely operated NPN vertical transistor. Discussion thereof is further found in Integrated Injection Logic, *Microelectronics and Reliability*, Pergamon Press, 1972, (Great Britain), Volume 11, page 94, and in Integrated Logic Circuits, *IEEE International Solid State Circuits Conference*, 1972, pages 90–93. Application of such integrated injection logic circuitry into an electronic digital wristwatch has also been suggested utilizing logic directly coupled in electronic stacks.

Accordingly, an object of the present invention is to provide an electronic digital watch in integrated injection logic whereby circuit components are electrically stacked in series with the stacks intercoupled by diodes. Another object of the invention is to provide such an integrated injection logic watch with a countdown chain having graded power due to varying transistor geometries such as varying injector geometries. Yet another object of the invention is the provision of an electrically stacked oscillator/regulator series combination in such an I²L watch to reduce system power consumption. Still another object of the present invention is the utilization of asynchronous counters synchronized with the system clock signal between functions, preferably utilizing D flip-flops implemented in integrated injection logic and having respective Q outputs fed back to the $\overline{D}$ inputs for minimizing component requirements.

Briefly, and in accordance with the present invention, a bipolar electronic watch is implemented in integrated injection logic such that the countdown chain and counters are partitioned into a plurality of levels which are serially connected between first and second reference potentials, with the logic levels interconnected through a series diode. Current passes through one level for actuating the parallel connected elements therein, and is then collected and coupled to the succeeding level and so forth. The various levels have differing number of gates connected in parallel in each, and geometry of the emitter injector elements vary for grading the power distribution. Asynchronous counters are synchronized with the system clock so that the system clock is selectively input into the succeeding counter instead of the previous counter output for minimizing gate logic requirements. A current regulator is connected in series with an oscillator and is configured so as to provide a highly regulated timekeeping signal with a minimum of system power consumption. D flip-flops comprising the countdown chain are implemented such that the Q output thereof is fed back to a $\overline{D}$ input for minimizing component requirement. The injector in the integrated injection logic gates has a geometry varying so as to regulate and control power supplied to the respective gate.

Other objects and advantages of the invention will be apparent upon reading the following detailed description of illustrative embodiments in conjunction with the drawings, wherein:

FIGS. 2a–2c depict the stacked logic levels of the I²L logic in accordance with the invention;

FIGS. 4a–4l illustrate specific circuitry for implementing the detailed functional block diagram of FIG. 3 in I²L logic;

FIG. 5 depicts the regulator/oscillator combination utilized in the invention;

Figure 1:
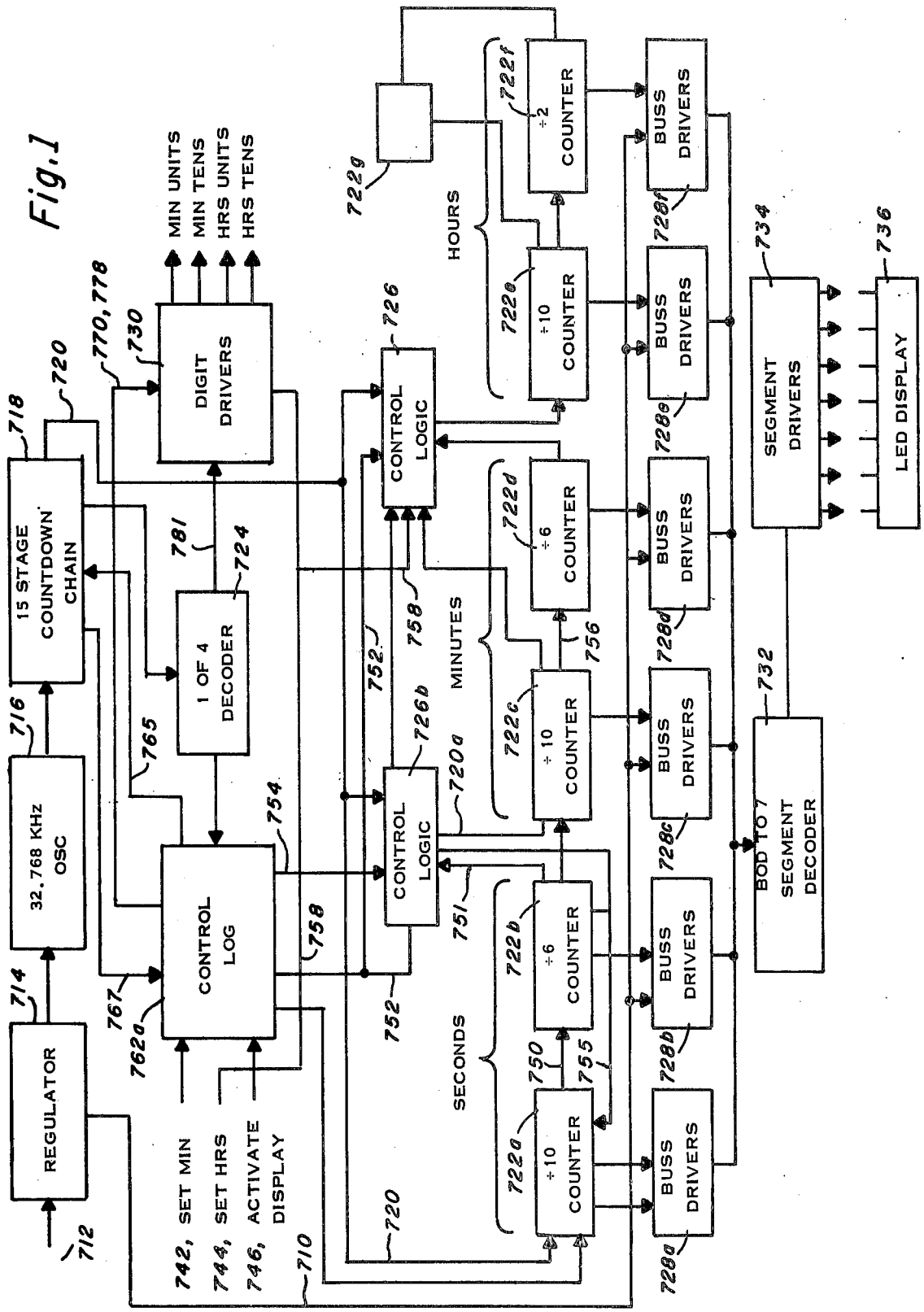
FIG. 1 is a functional block diagram of an electronic digital wristwatch.

With reference now to the drawings, a functional description of a general watch system, a specific logic implementation thereof featuring asynchronous synchronized counters and then a specific I²L circuit implementation thereof will be set forth. The following description is best understood by considering FIGS. 1, 3 and 4 in combination, realizing that FIG. 3 is a detailed embodiment of FIG. 1, and FIG. 4 is a detailed version of FIG. 3. Thereafter, specific circuits utilized in the I²L circuit of FIG. 4 and specific integrated circuit improvements thereof will be described.

With reference to FIGS. 1, 3a–3k, and 4a–4k, the electronic elements of a digital wristwatch in accordance with the present invention is set forth. Batteries 701 generate a nominal 3 volt $V_{CC}$ input 712 to a regulator 714. A crystal controlled oscillator circuit 716 generates a 32.768 K Hertz timing signal to a fifteen stage countdown chain 718. The series regulator 714 and oscillator 716 combination is a feature of this invention and will be discussed in detail with respect to FIGS. 2b–2c and 5a–5b.

The 32.768 K Hertz master clock signal is coupled to the countdown chain 718 via inverter 114. Inverter 114 is a multi-collector I²L transistor pair and operates in a now well understood manner. For example, output transistor 18 in the oscillator 716 functions to render inverter transistor 114 nonconductive when driver transistor 18 is rendered conductive. As will be explained in more detail with respect to the circuit of FIG. 6, the gate input to the I²L transistor pair is used to functionally "turn off" the gate by removing the injection drive.

Countdown chain 718 comprises a fifteen stage ripple counter having six successive toggle flip-flops, a two stage Johnson counter, and seven additional successive toggle flip-flops. The output of the last flip-flop in the chain 718 generates the basic 1 Hertz timekeeping signal, which is communicated via line 720 to the counters. The last three stages of chain 718 are resettable for allowing accuracy of ⅛ second when time setting the watch. By gating via element 304 the 1 Hertz output signal with the 1, 2, 4, 8 and 16 Hertz countdown signals, a pulse width is generated of approximately 0.03 seconds, representing a 1/32 duty cycle. As this signal is utilized as an input to the various counters, in part responsive to the setting switches 742 and 744, the possibility of error due to inherent bouncing of switches 742 and 744 is minimized, as occurrence of the 0.03 pulse and actuation of the setting switch must be coincident. The countdown chain is generally comprised of a plurality of series connected D flip-flops implemented in I²L logic. The specific D flip-flop configuration herein utilized is a feature of this invention and is explained in detail with respect to FIG. 6.

The 1 Hertz system clock is coupled to asynchronous counters 722a–722f which respectively generate the seconds (tens and units digit), minutes (tens and units digit), and hours (tens and units digit) function. Tens digit counter 722a is a divide by ten asynchronous counter which provides a binary coded decimal output at each of four stages to effect the units digit of the seconds display. Tens digit counter 722b is a divide by six asynchronous counter which is responsive via line 750 to the counter 722a output which generates a binary coded decimal output indicative of the tens digit of seconds. The overall combination of counters 722a and 722b comprise an asynchronous divide by sixty counter for effecting tens and units digits of seconds display.

The output of the seconds counter 722b is coupled to control circuit 726b via line 751. Control circuit 726b is responsive to control circuit 726a via line 752 and to the 1 Hertz clock via line 720 for either coupling via line 720a one pulse of the 1 Hertz clock under control of the seconds counter 722b into counter 722c or coupling a series of 1 Hertz signals into counter 722c for rapid setting of the minutes. By locically coupling the output of the asnychronous counter to control circuitry for selectively coupling the system clock into the succeeding counter, less logic is required than otherwise if the asynchronous output and the clock are selectively input. Control circuit 726b is also responsive via line 754 to control circuit 726a for resetting via line 755 the seconds counters 722a and 722b to zero during "setting" of the watch.

The input to the tens digit minutes counters 722c via line 720a is either at the one per minute rate or one per second rate as controlled by control circuit 726a as above explained. Counter 722c is an asynchronous divide by ten counter for generating binary coded decimal outputs indicative of the ones digit of minutes. Counter 722d is an asynchronous divide by six counter for generating in response to counter 722c binary coded decimal outputs indicative of the tens digit of the minutes. The $\overline{Q}$ output from one collector of transistor 425 of the minutes counter 722c is coupled via line 757 back into the counter 722c for effecting a ring counter and is "wired anded" for resetting. The other collector output is input into counter 722d via line 756.

Output from counter 722d, 722c and from the control logic 726b and 726a is fed into control logic 726c for controlling input into the hours counters. Control 726c logically comprises a NAND gate 437 responsive to a BCD 5 and BCD 9 code from counters 722c and 722d and to line 752 from the control circuit 726a for enabling an output from gate 437 upon the five-nine condition. The output of gate 437 is logically NANDED with the output from the set hours switch 744 via line 758. Whenever the set hours switch is set via line 758, or the five-nine condition on the input to gate 437 is met, NAND gate 436 is enabled allowing the 1 Hertz signal via line 720 to be input into the hours counter 722e. Depending upon whether or not the set hours line is enabled, or the output from gate 437 is enabled, then either a single 1 Hertz pulse is input into the hours, or a series of 1 Hertz pulses is input for setting the hours counter. It is noted that the logic NAND function is implemented in a hard-wired manner as in the detailed circuit schematic of FIG. 5. Likewise, the logic NAND gate 437 is hard-wired to the base input of transistor 437. During the period when the hours counter is not to be incremented, transistor 436 is in a normally conductive condition thereby clamping the 1 Hertz signal on line 720a to a logic zero.

The units digit of the hours counter 722e is responsive to line 720b for either incrementing by one each sixty minute cycle or by incrementing by one at the 1 Hertz rate. Counter 722e is an asynchronous divide by ten counter while stage 722f in combination therewith provides capability of dividing by 20 for effecting tens digit read out. Feedback means 722g, however, causes the counters 722e and 722f to be recycled every twelve states (from one to thirteen) to provide the desired hour BCD output.

Referring now to control logic 726a, actuation of the activate display switch 746 on line 760 which is inverted on line 761 causes the $\overline{Q}$ output of D flip-flop 35 to go to a logic one which is communicated to NAND gate 189 causing a logic zero on the output thereof. Line 773 communicates this condition back to the D input of flip-flop 35 causing the D input to latch at a logic low level for approximately one 1½ seconds regardless of the condition of the activate display switch. This output is communicated by line 774 to digit enable logic gate 141 which enables gates 145–148 for enabling the respective digit drivers 730. Thus, immediately upon actuation of the activate display switch, the minutes and hours digits of the display are activated.

The high $\overline{Q}$ output of flip-flop 35 is then ANDED with the 8 Hertz signal via line 767 from the countdown chain with the normally high output from NAND gate 219 on line 768 to allow the 8 Hertz signal to ripple through stages 36–39. Between 1⅛ and 1½ seconds later, NAND gate 218 receives logic one inputs from flip-flops 37 and 39 to generate on line 769 a logic zero signal to NAND gate 189 for disabling the minutes and hours display. Substantially, simultaneously therewith, NAND gate 219 receives an all logic one input and generates on line 768 a logic zero which re-enables the minutes drivers from logic 730 by way of line 770 and disables the input to flip-flop 36. If the activate display switch has been held down during this interval such that a logic zero is still applied via line 761 to flip-flop 35, then the reset terminals to flip-flops 36-39 remain impressed with a logic zero voltage and NAND gate 219 is allowed to activate NAND gates 143 and 144 for enabling output from the seconds counter 722 to be displayed. Gates 143-148 are serially coupled by diodes to the output of the respective counters for disabling except when display is desired. In the circuit schematic of FIGS. 4a-4k, the various logic levels may be identified by referring to the emitters of the $I^2L$ transistors. A first level logic emitter is shown having a single ground bar indication to indicate a reference potential, the second logic level is shown having a double bar reference potential indication on the emitter. The third logic level is seen having three bar indicators on the emitter. Such will be explained in more detail subsequently in conjunction with FIG. 2.

Referring to FIGS. 4a-4k, it is seen that the collector of gates 143-148 have their emitters tied to the second logic level in integrated injection logic whereas the anode of the respective diodes D13-D18 are coupled to the base of gates having their emitters respectively coupled to the third level of integrated injection level logic. Inclusion of diodes D13-D18 serially between electronic logic levels in this system is a feature hereof. That is, by utilizing the approximately 0.7 volt drop when gates 143-148 are driven conductive, then less voltage swing thereon is encountered. Such improves switching time and therefore performance.

Upon release of the activate display switch 746 during display of the seconds, the $\overline{Q}$ output of flip-flop 35 returns to a logic zero level on line 762 causing logic one inputs to the reset terminals of flip-flops 36-39 causing gates 218 and 219 to return to a logic one state. When gate 219 returns to a logic one state, line 770 returns to a logic one and the minutes (seconds) drivers are disabled. Likewise, gates 143 and 144 decouple the output from the seconds register from the decoder 732.

Upon the activate display input to flip-flop 35, a logic one from the $\overline{Q}$ output is supplied via line 763 to the set terminal of flip-flop 42 which causes the Q output thereof to go to a logic one. Line 765 couples this logic one to gate 287 which resets the last three stages of the countdown chain 718. Such enables a more accurate setting of the time, up to approximately ⅛ of a second accuracy. Furthermore, the Q output of flip-flop 42 is coupled via line 754 to NAND gate 408 which resets the seconds counter via line 755.

Upon actuation of the set minutes switch 742, a logic zero is generated on line 777 to the D input of flip-flop 40 and to the wired AND gates which are input to NOT gates 159, 160. A logic one is impressed on the inverted D input to flip-flop 41 causing a low to be generated on the $\overline{Q}$ output thereof which is inverted on lines 752 and 778. Line 752 actuates the control 726b for enabling setting of the minutes register 722c at a rapid 1 Hertz rate due to line 720a.

Line 778 from the $\overline{Q}$ output of flip-flop 41 is coupled to logic gate 141 for enabling the output from the minutes and hours counters to be input to the segment decoder 732 and is further communicated to the digit drivers 730 for actuating the minutes and hours drivers.

Upon actuation of the set minutes switch 742, the $\overline{Q}$ outputs of flip-flops 40 and 41 go high which sets the Q output of flip-flop 42 by means of line 764. Upon the actuation of the set minutes switch 742, the $\overline{Q}$ output of flip-flop 40 goes low, removing the set from flip-flop 42 allowing the Q output to go to a logic zero on the next clock pulse thereafter. A zero on Q output line 765 sets NAND gate 287 which stops the watch by resetting the last three digits to zero of the countdown chain and resets the seconds counter to zero.

Actuation of the set hours switch 744 via line 779 directly enables the logic gate 141 for coupling the hours counter to the bus drivers and actuates the minutes and hours digit drivers. Furthermore, via line 780 the set hours switch is coupled to control logic 726c for enabling NAND gate 436 to allow the 1 Hertz clock via line 720b to increment the hours counter by an appropriate number of pulses for time setting.

Referring now to the one-out-of-four decoder 724, a plurality of NOR gates 132-139 are responsive to lines 738 from the countdown chain 718 for generating a one-out-of-four select. A duty cycle of approximately 23% or 24% is chosen so that only one of the four outputs from the one-out-of-four decoder is actuated at any one time. Outputs 781 are coupled to NAND gates 143-148 for selectively coupling the contents of the respective seconds, minutes, and hours registers on to the bus lines for communication to the decoder 732, and lines 781 are coupled to the digit drivers for enabling each digit sequentially per cycle.

Referring now to the bus drivers 728, a plurality of open collector NAND gates 512, 514-520, 523-530 and 533-540 are provided for driving the bus lines 729 which couple the counters to the decode matrix 732. Inverters 511, 521, 522, 531, 532 and 541 are responsive to the control logic 726a and specifically to NAND gates 143-148 for selectively coupling the contents of the appropriate register on to the bus line at the appropriate time. That is, during the display minutes/hours cycle, inverters 522, 531, 532 and 541 sequentially effect communication of the four digits of the minutes and hours counter on to the bus lines 729 per cycle. Upon the display seconds mode, inverters 511 and 521 effect serial communication through the bus drivers on to the bus lines of the units and tens digit from the seconds counter.

Coupled to the bus lines for receiving the selectively transmitted information from the respective counter is a BCD seven segment decoder 732. The binary coded decimal information from the respective counters are logically decoded to drive a conventional seven segment display. The display blanks on state 15, or a BCD code of 1111 so that during the period of time when the digit drivers 730 are deactuated, the segment drivers are also deactuated. The output of the decoder 732 is coupled through drivers 732 to the output pins which lead to the display. Drivers 732 are implemented using conventional multi-emitter TTL logic.

Figure 2B:
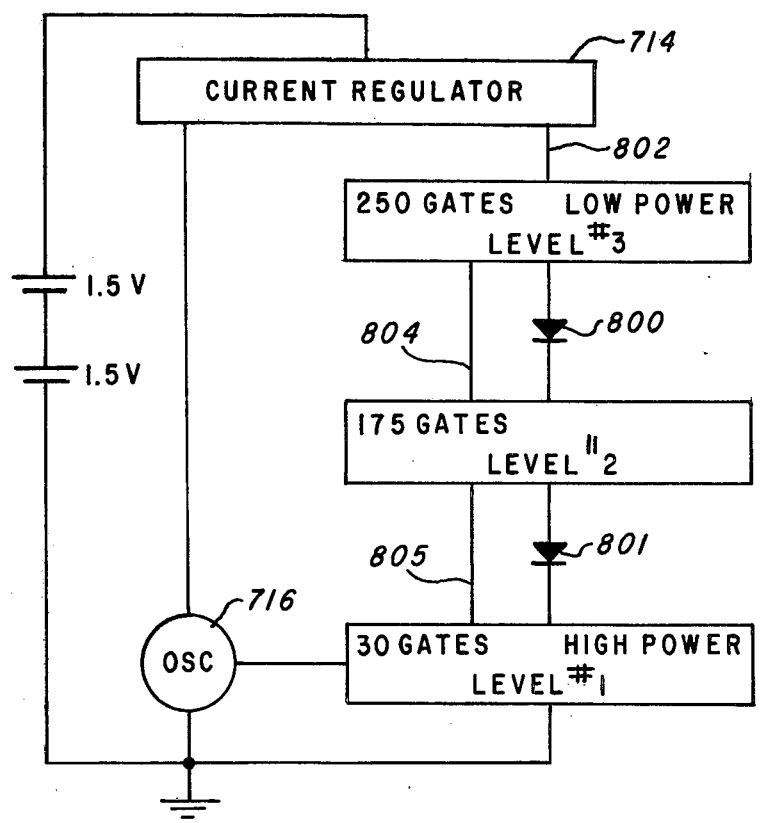
Figure 2C:
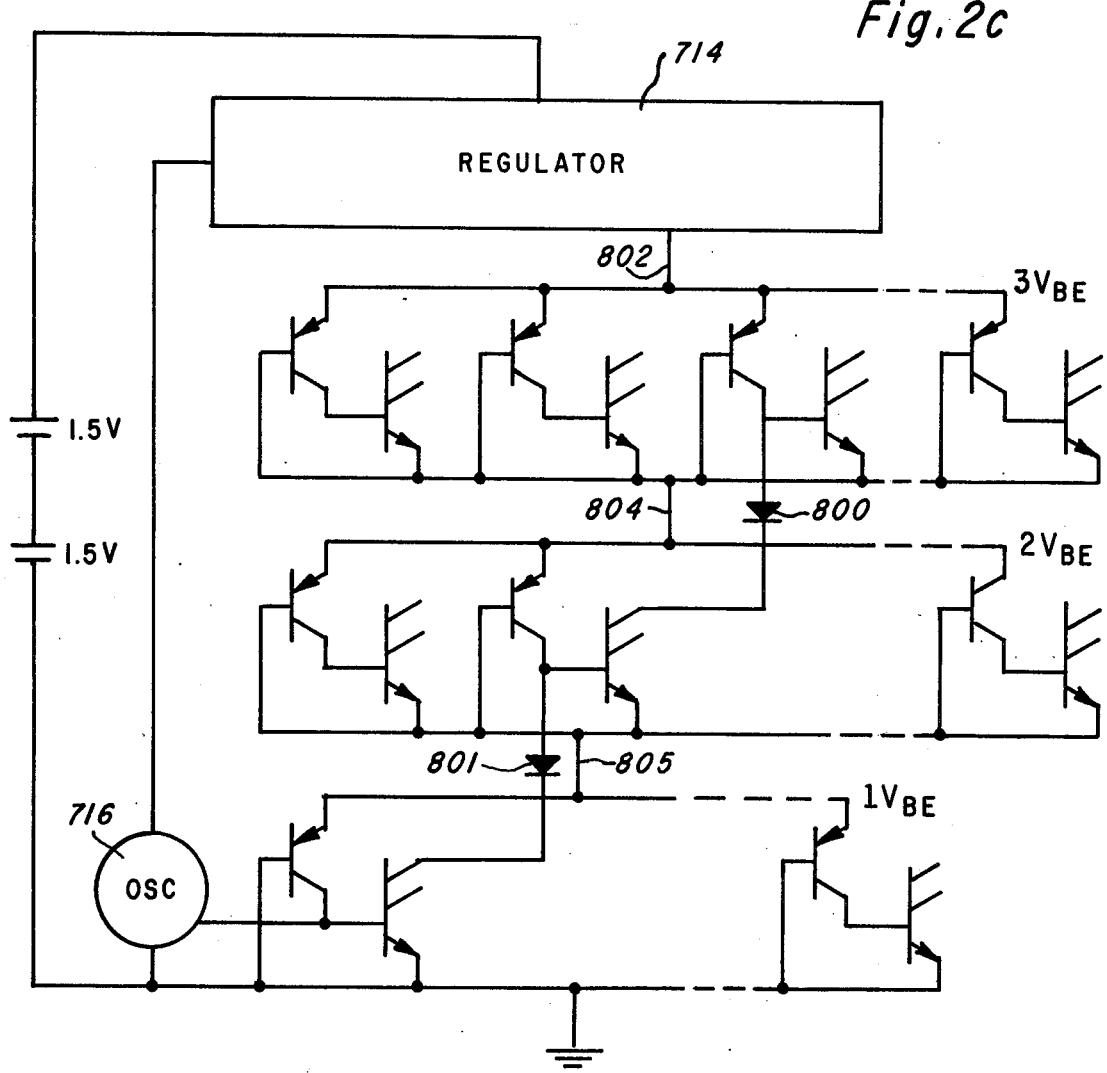
Figure 3A:
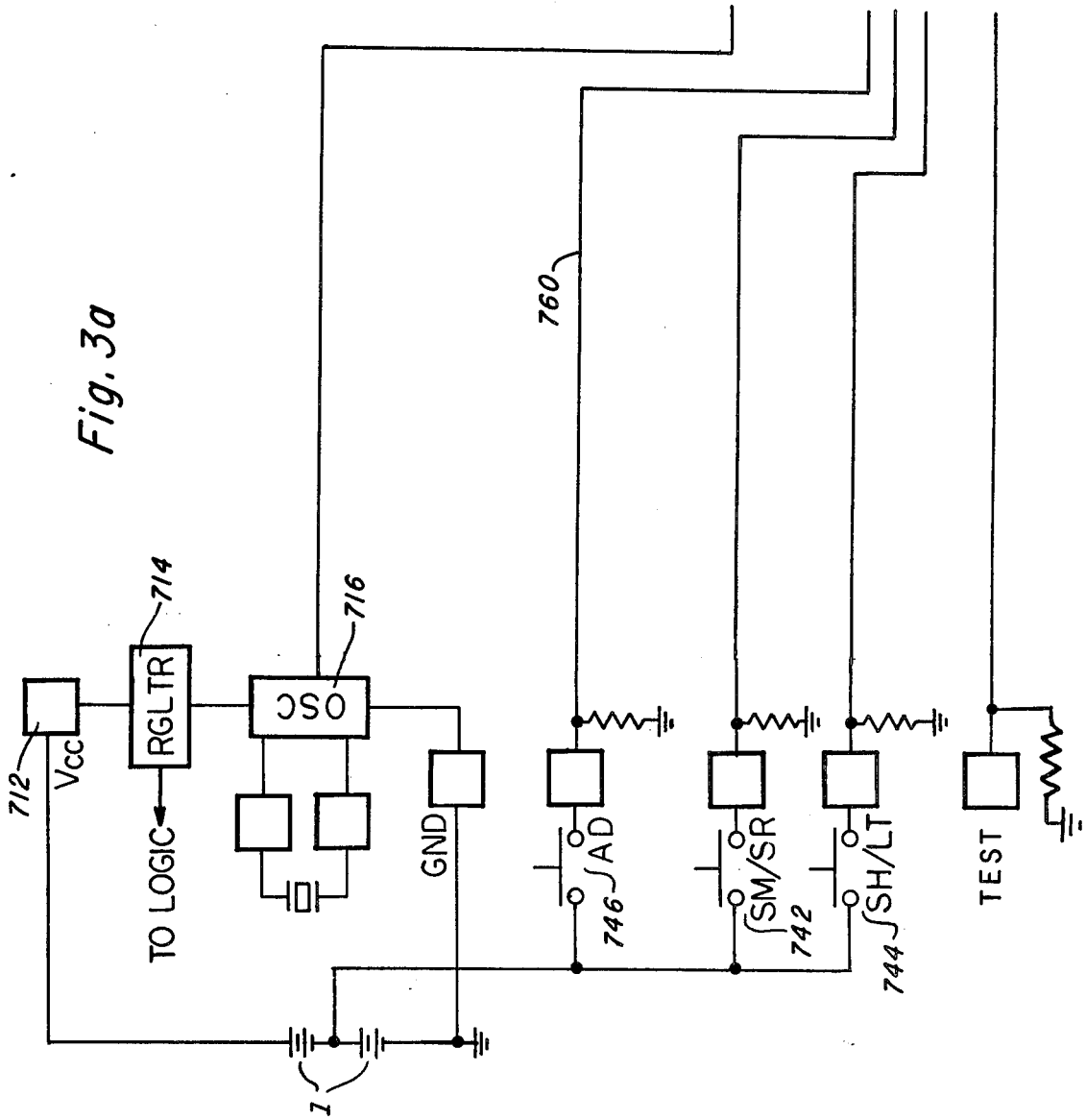
FIGS. 3a–3f depict a detailed functional diagram of the electronic watch depicted in FIG. 1.
Figure 3B:
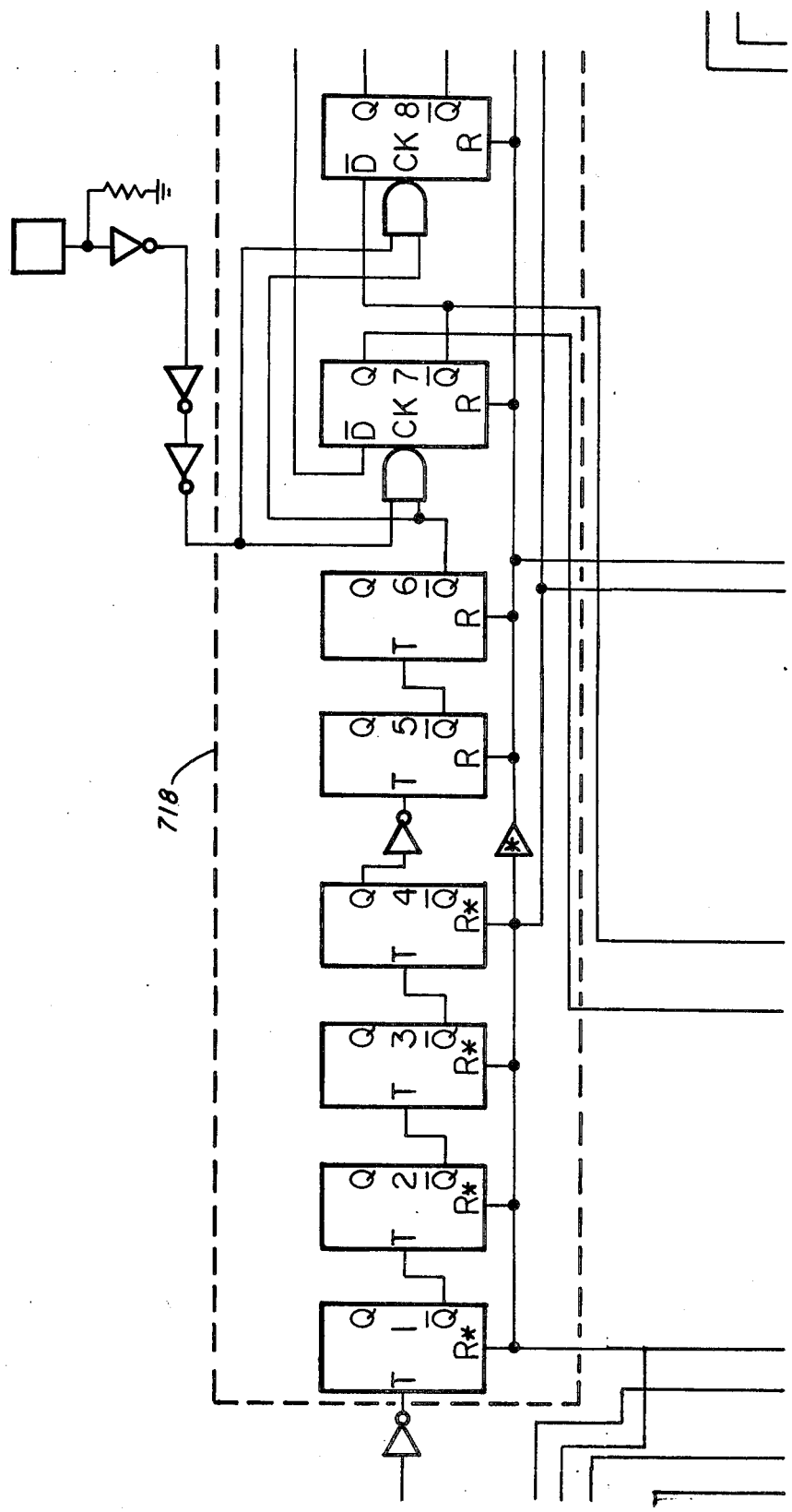
Figure 3C:
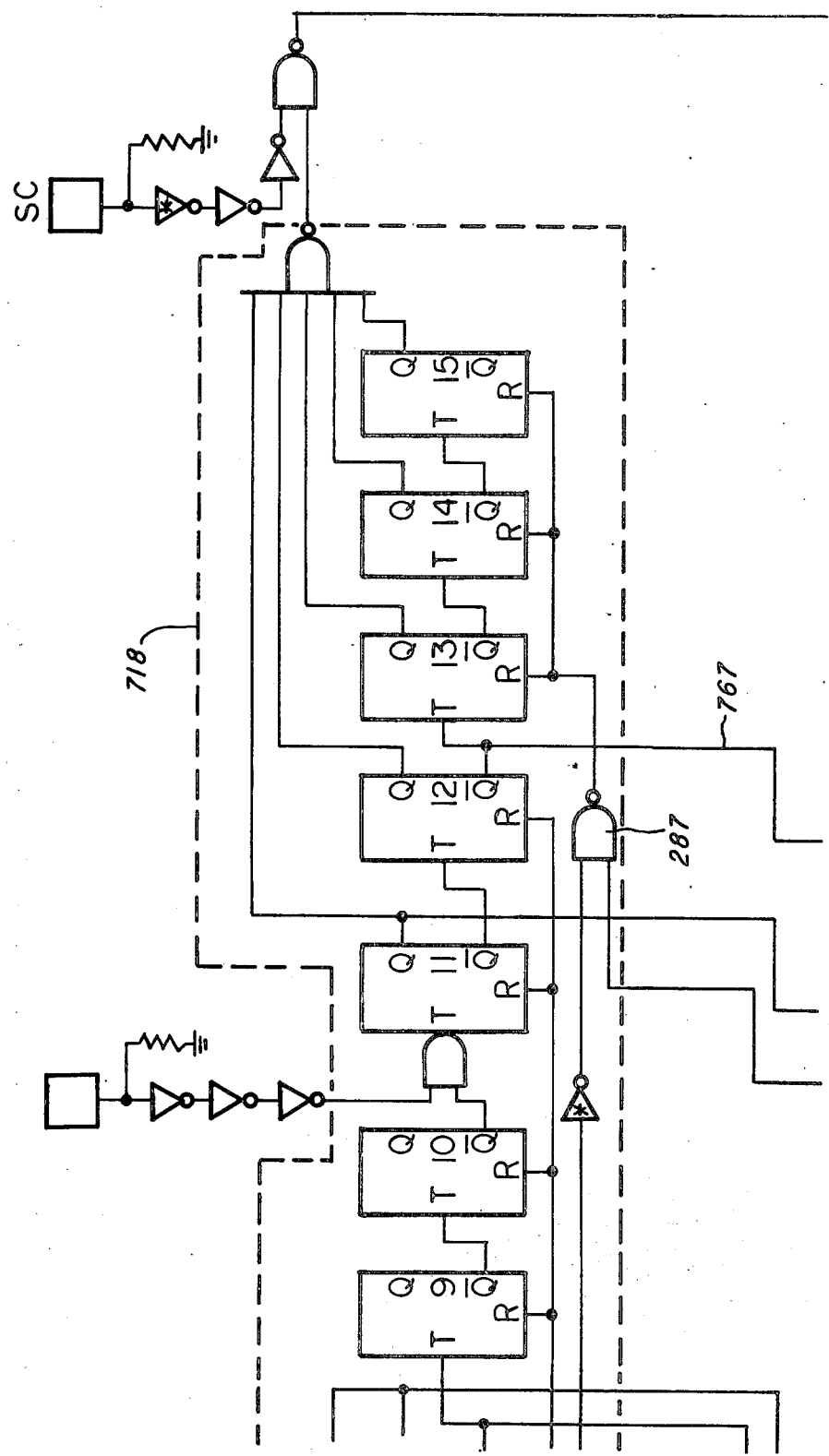
Figure 3D:
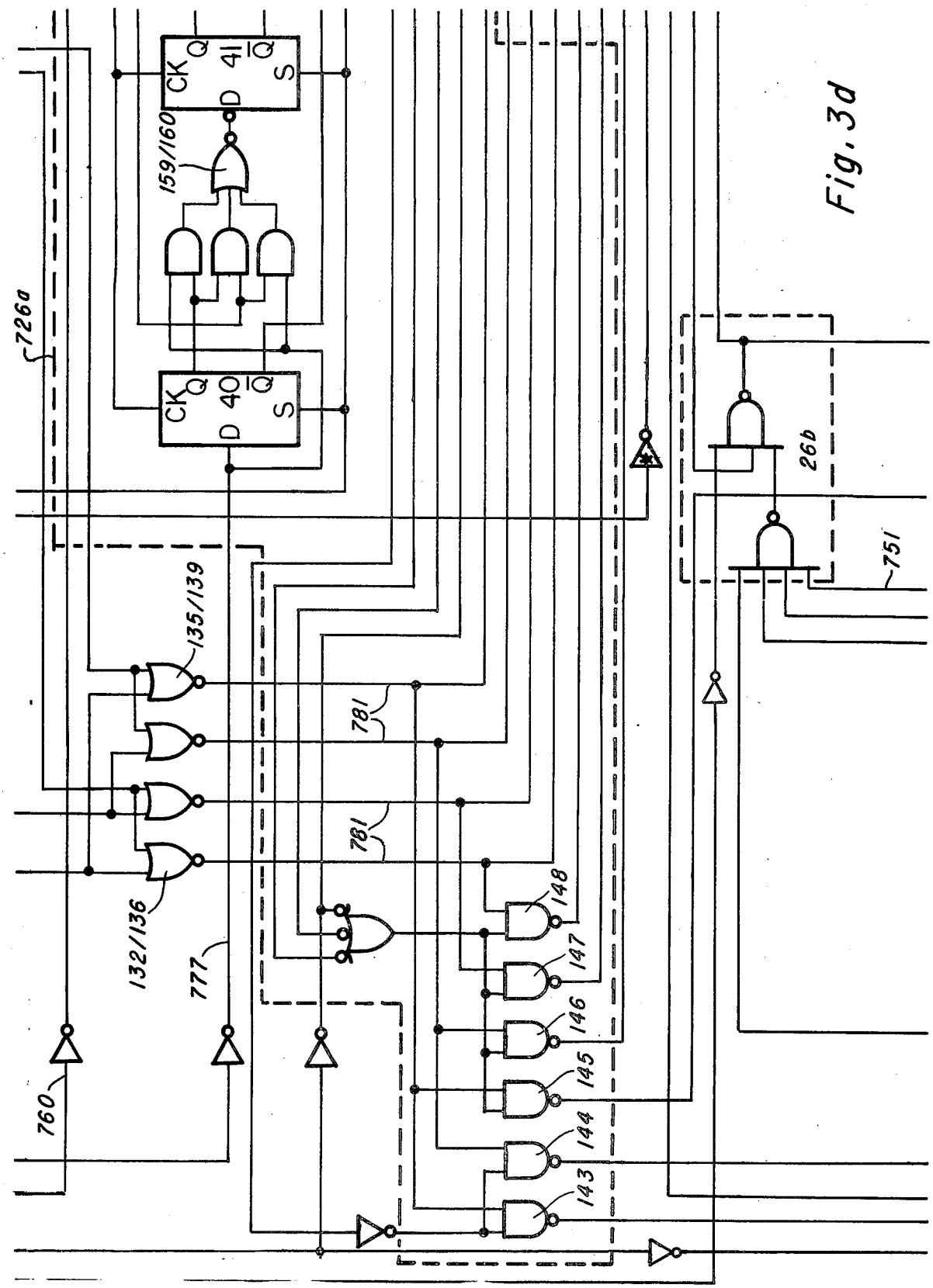
Figure 3E:
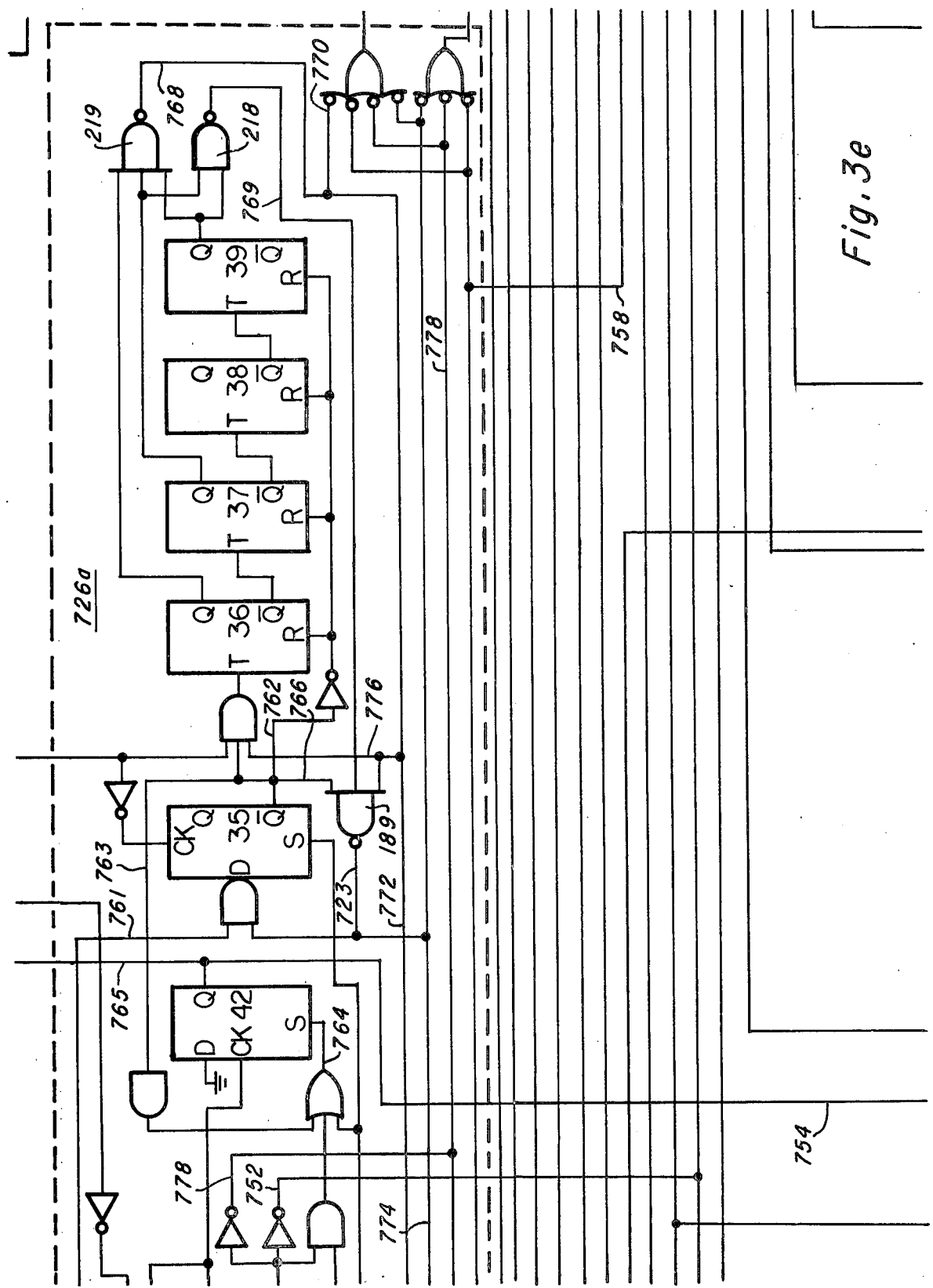
Figure 3F:
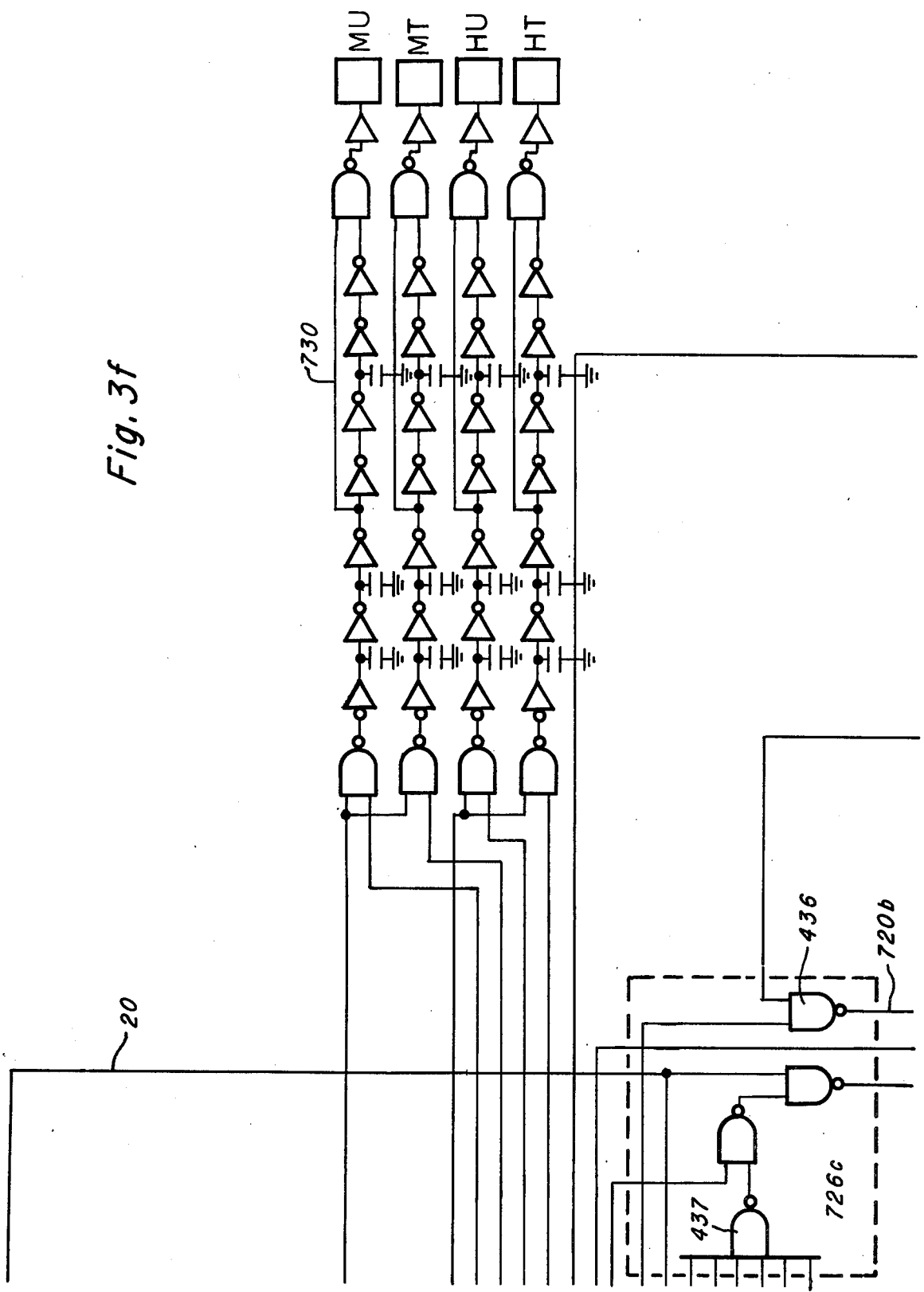
Figure 3J:
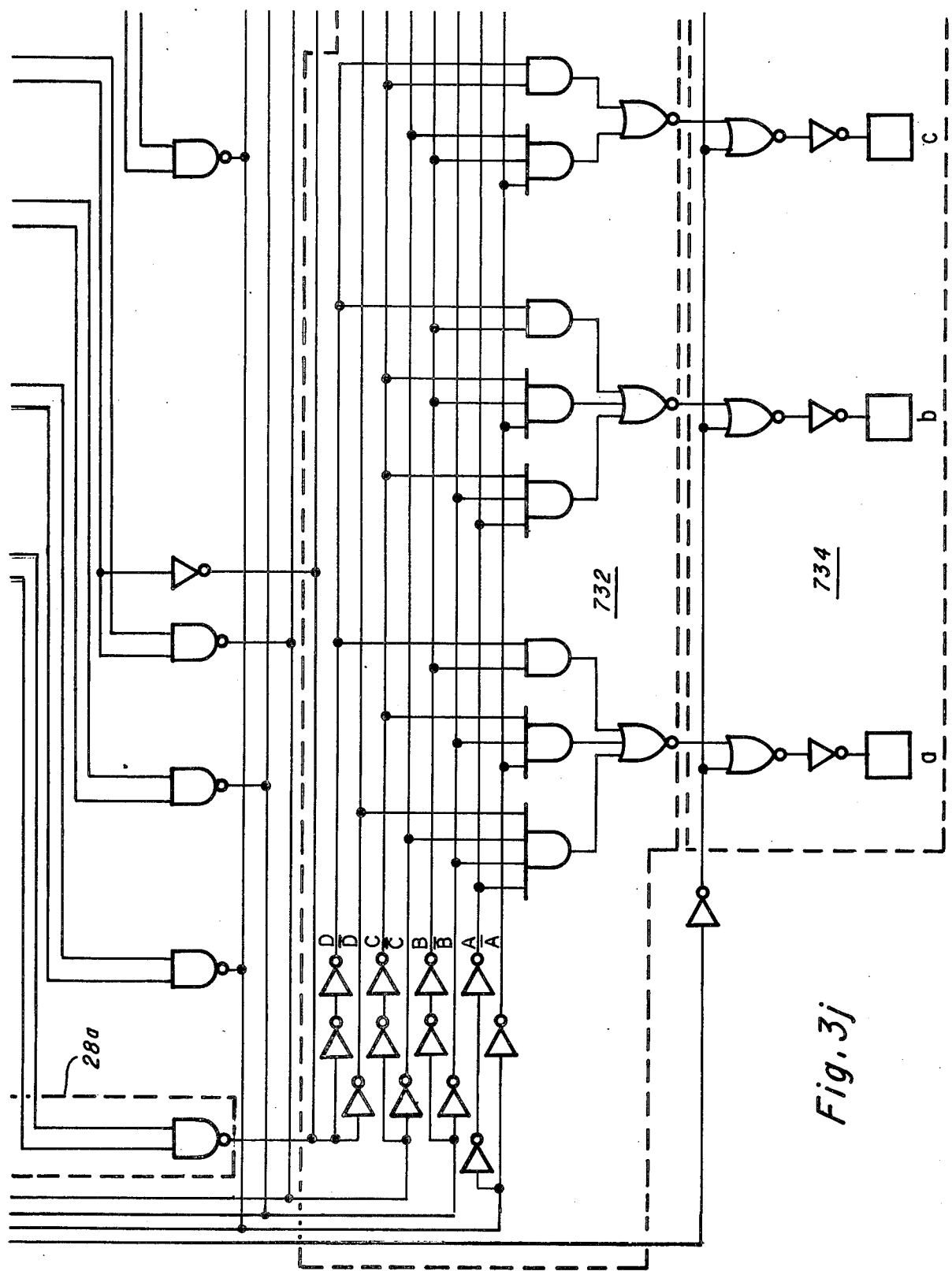

Referring now to FIGS. 2a-2c, there is depicted a cross-sectional representation and functional and device representations of the electronic system of FIG. 1 wherein the integrated injection logic circuitry is implemented in serially connected stacked regions separated by diodes. The gate cell depicted in each of levels 1-3 is as generally shown and described in the above referenced 1972 *IEEE ISSCC* article. That is a P type substrate 806 is Boron doped to a resistivity of 10-20 ohm-centimeters and has an overlying epitaxial layer 807 of 0.19-0.23 mils thickness. Layer 807 has a resistivity P of 0.3-±0.02 ohm-centimeters. Underlying the I²L logic cell is an N+ antimony doped DUF layer having a sheet resistivity $\rho_s$ of 10-16 ohms per square and a thickness of 0.37-0.43 mils for lowering the emitter resistance. P+ isolation diffusion areas 802 extend into the substrate 806 for isolating and forming each logic level. P type regions 900 and 901 are Boron doped to a sheet resistance of 180-300 ohm/square and extend into the epitaxial layer 807 approximately 9-10 Hg lines. N+ regions 808 and 810 exhibit a shut resistivity of 4-12 ohm/square and extend into P region 901 approximately 7-8 Hg lines. The above semi-conductor structure may be effected utilizing state of the art Schottky TTL type processing; for example, utilizing standard Schottky photolithographic technique and design layouts.

Regions 900-810-901 form the lateral PNP transistor utilized as the injector, with region 900 serving as the emitter thereof. Regions 808-901-810 function as the inversely operated vertical NPN transistor.

A major improvement is the P substrate and the selective isolation by regions 802 of various combinations of cells into electronic logic level and then the selective interconnection of levels by means of diodes 800 and 801. The basic concept of electronically stacking levels on a single substrate is specifically disclaimed by the applicant of this invention, but the inclusion of diodes 800 and 801 between logic levels is a technical advance in the art. That is, the inclusion of diodes 800 and 801 with the cathode connected to the N+ collector region of the vertical, inverse transistor in one layer and the anode of the diode connected to the P conductivity collector region of the lateral PNP transistor in another level reduces the amount of voltage swing on the collector in the one region. This effects a faster switching speed and improves circuit performance.

Referring now to FIGS. 2b and 2c, there is shown a specific partitioning of the electronic digital watch system of FIGS. 4a-4k into the various stacked logic levels. FIG. 2c shows a specific circuit representation of the interconnection between logic levels as functionally depicted in FIG. 2b. For the low power digital watch of this invention, a predesignated amount of current preferably 6 microamps is generated by a pair of nominally 1.5 volt batteries is controlled by regulator 714. The current regulator 714 consumes and distributes 2 microamps to the oscillator 716 and distributes 4 microamps to the countdown and other divider circuitry. It is thus seen that only regulated current is communicated to the timekeeping circuitry of this invention for effecting a highly reliable and more efficient circuit. It is further seen that the 2 μa regulated current used by the regulator is not wasted, but is used by the series connected oscillator in generating the 32.768 KHz signal.

The 4 microamps current provided by current regulator 714 is impressed upon logic level 3 consisting generally of the counters 722 and decoder 732. The 4 microamps injector current is shown in FIGS. 4a-4k to be communicated to the counters and decode by way of line 802. As shown in FIG. 2b, there are approximately 250 gates in this #3 logic level, and these counters are operating at a maximum frequency of 1 Hertz. Such is a relatively low frequency, and accordingly the flip-flops comprising the counters require a relatively small amount of drive current. Therefore, a relatively large number of gates are placed on this level, and the 4 μa sufficient drive for the number of gates chosen. Graded power is discussed in more detail with respect to FIGS. 7a and 7b. The regulator/oscillator combination, set forth as a feature of this invention with respect to FIGS. 5a and 5b, generates the basic high frequency timing signal to the count down chain.

Figure 4A:
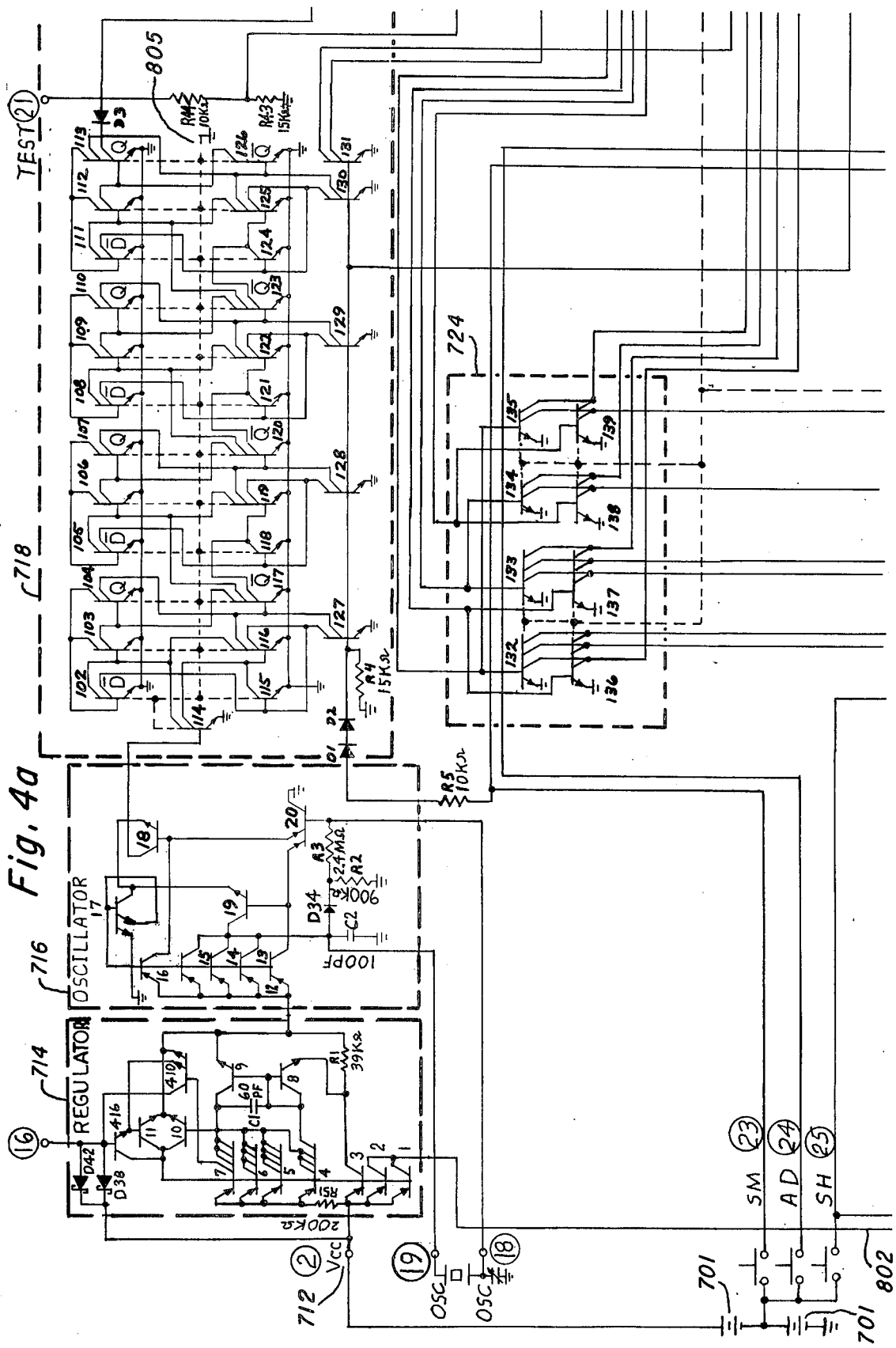
Figure 4B:
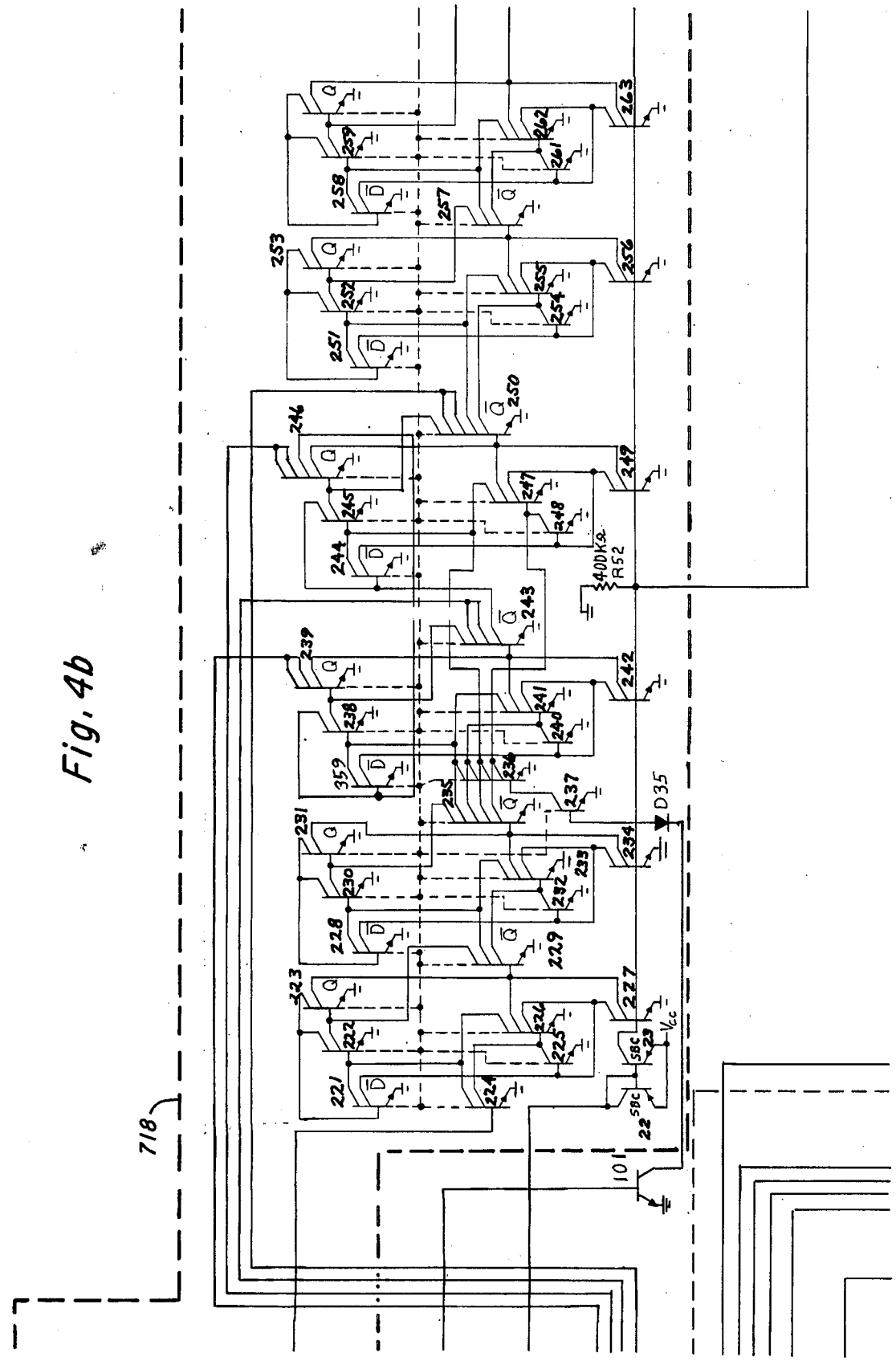
Figure 4C:
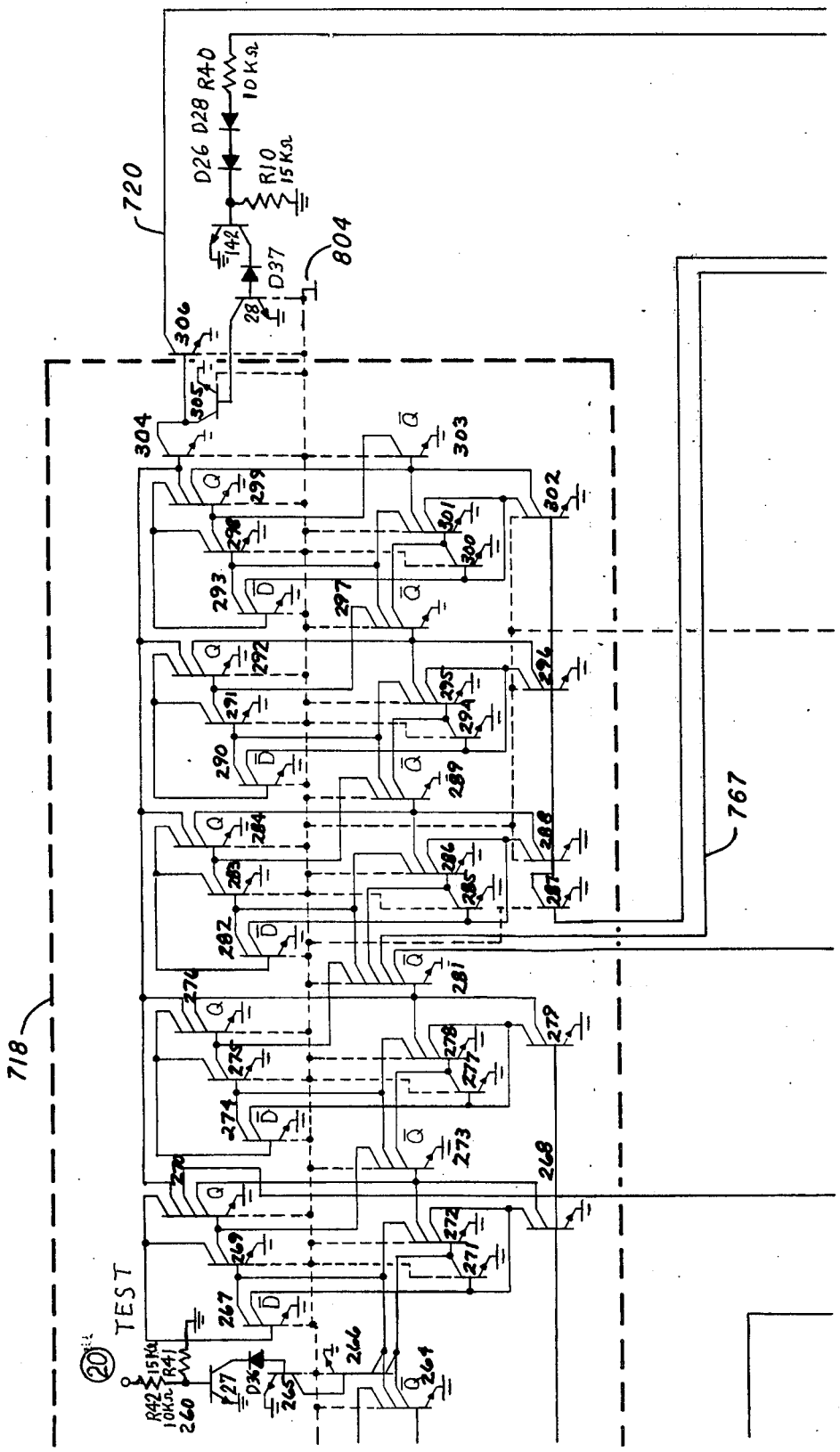
Figure 4D:
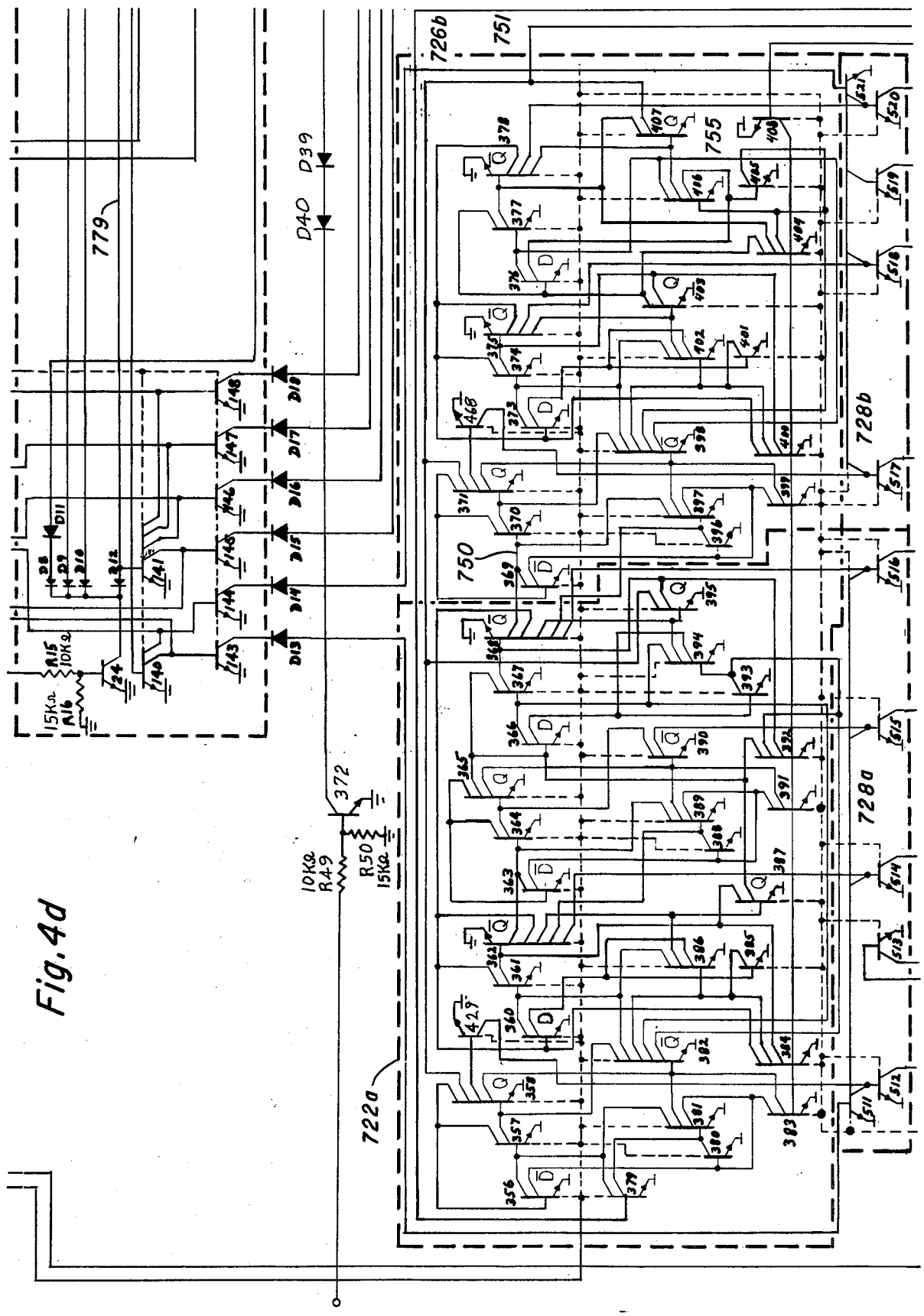
Figure 4G:
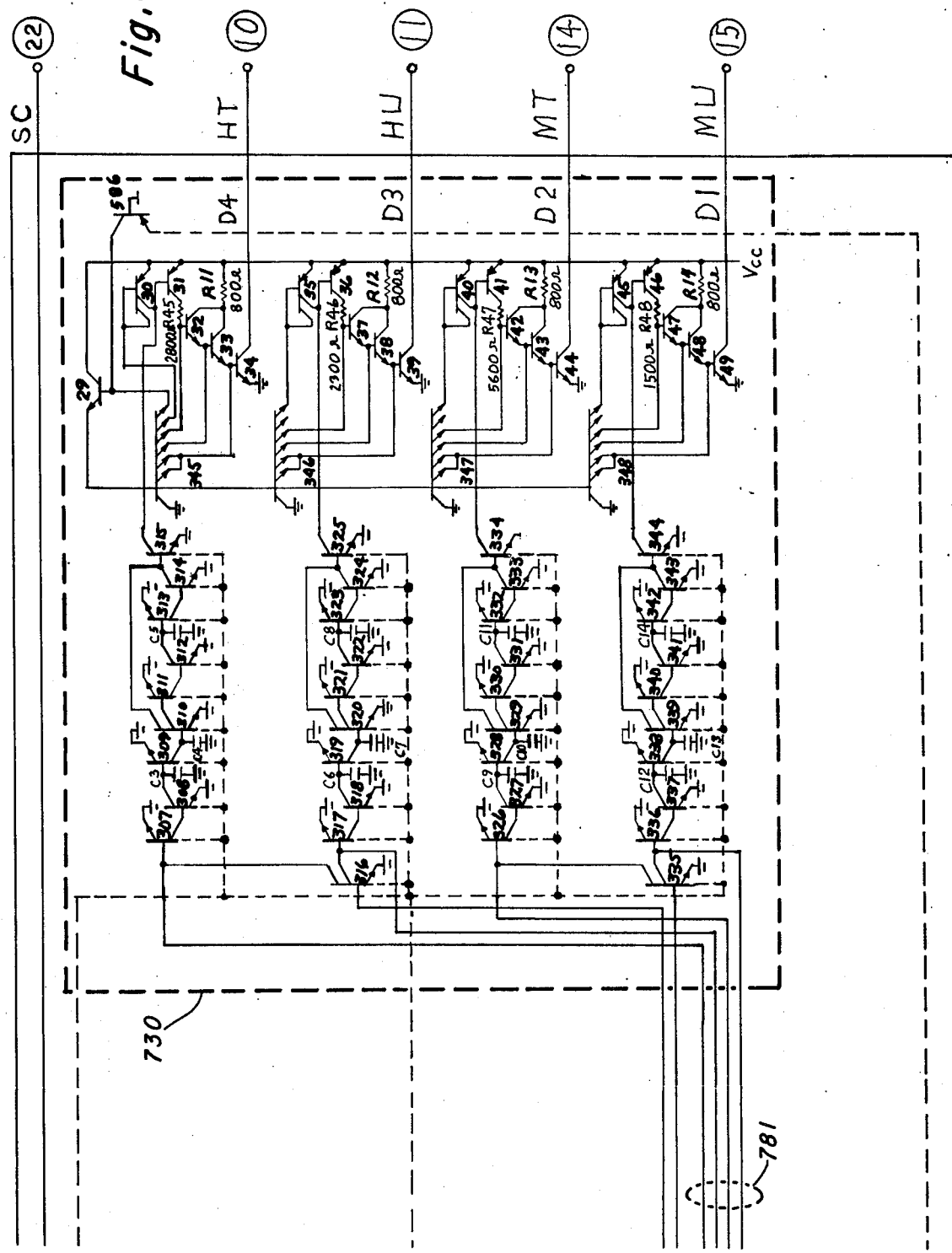
Figure 4H:
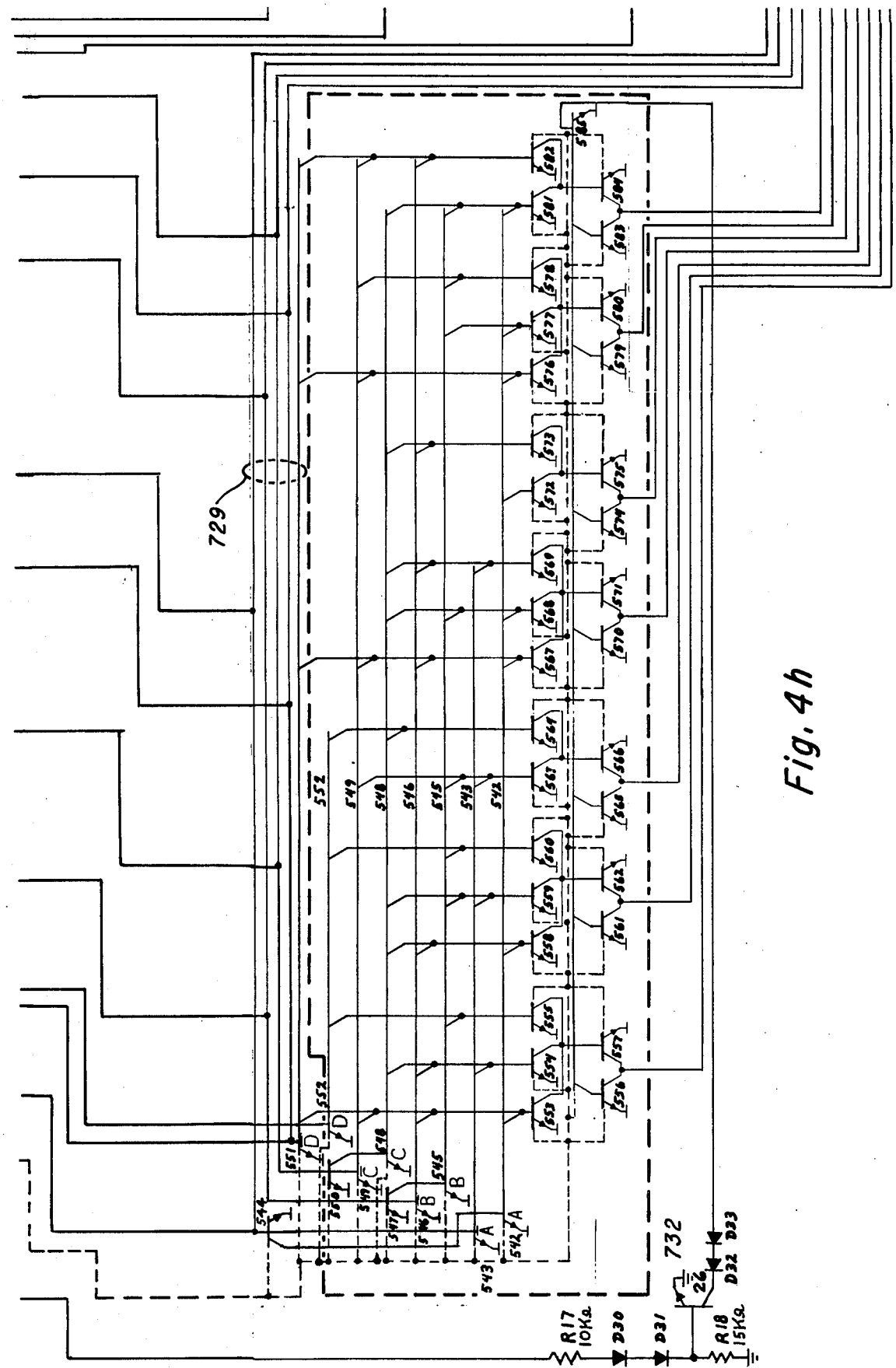
Figure 4I:
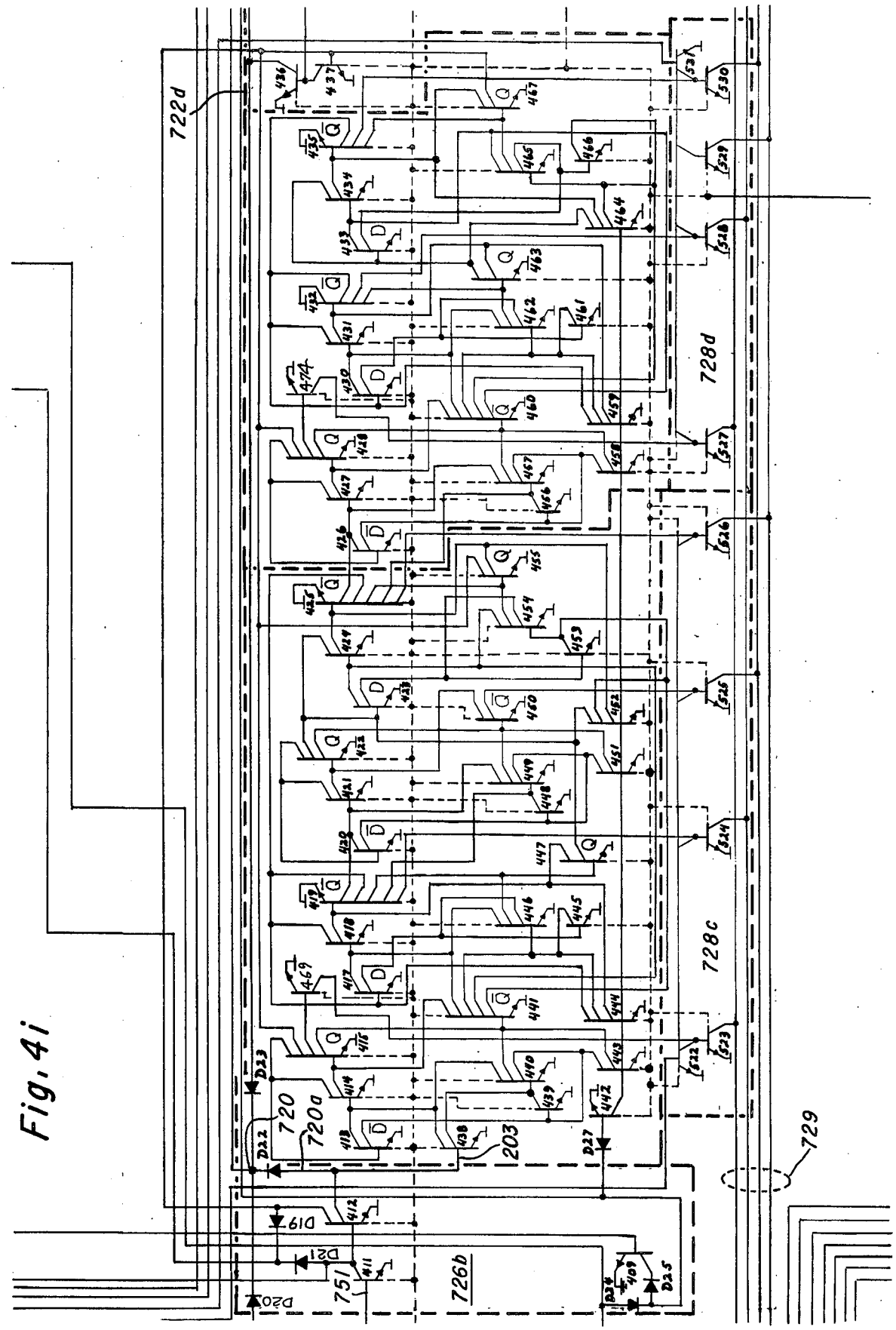
Figure 4J:
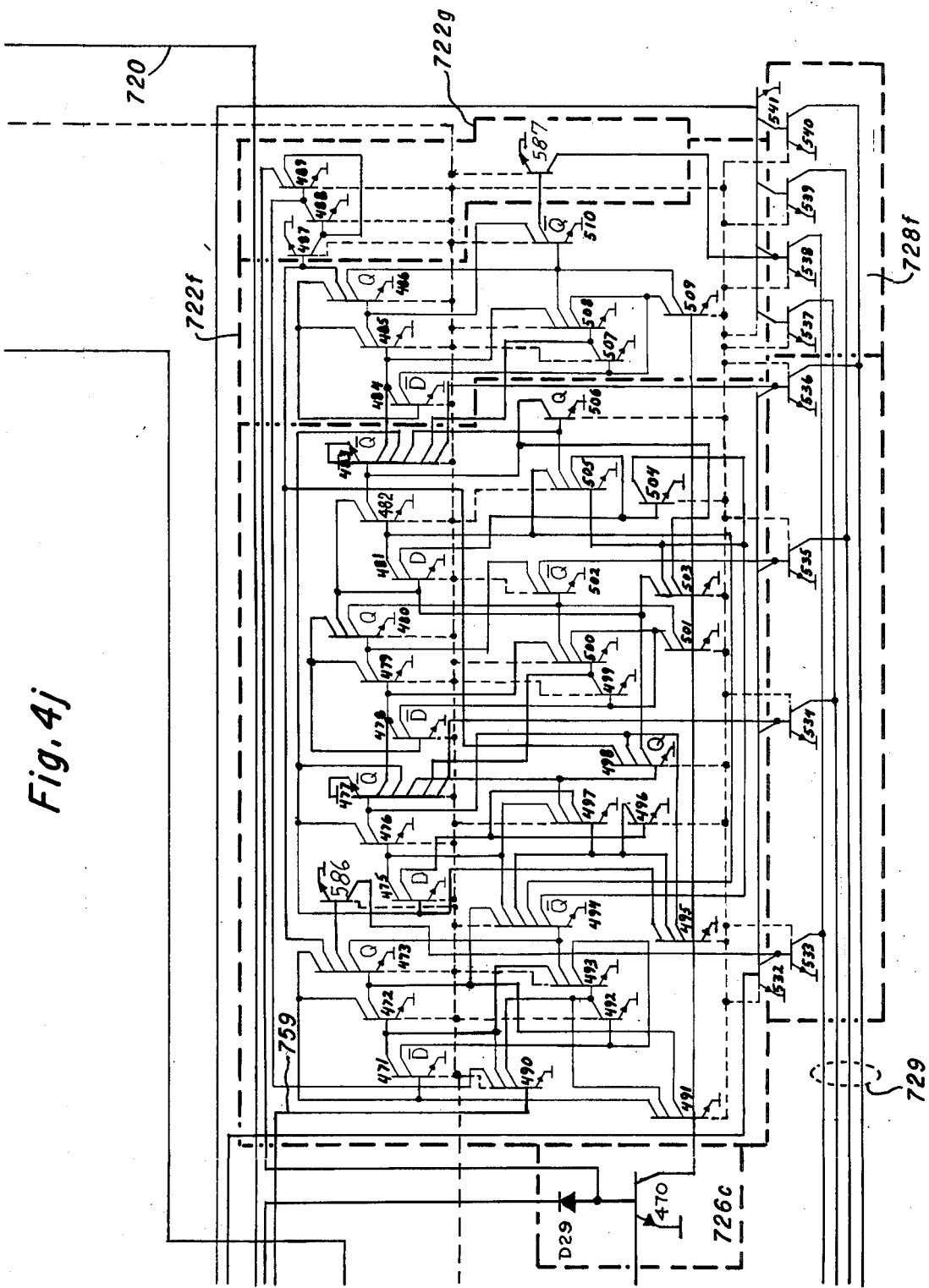
Figure 4K:
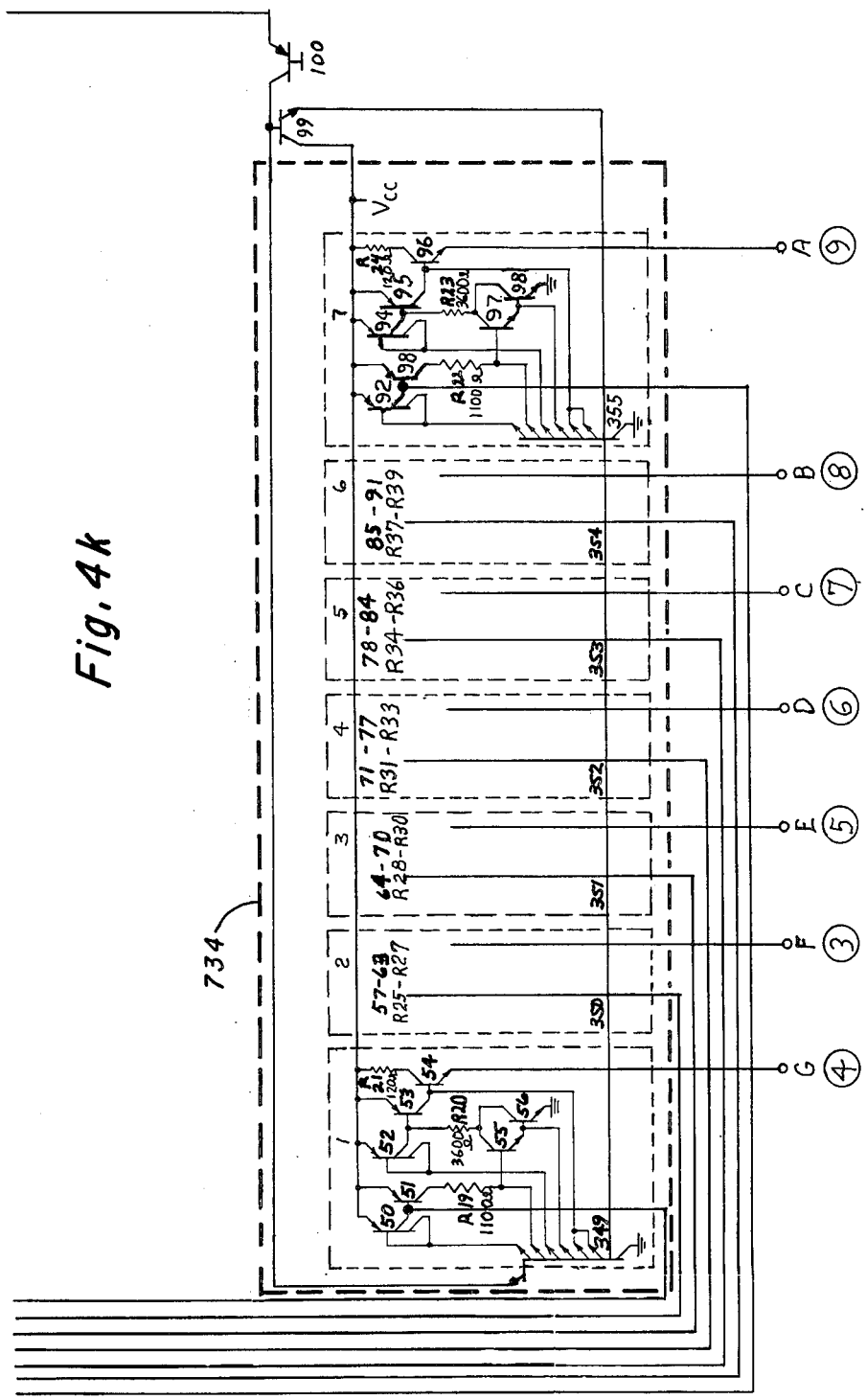

The 4 microamps injector current in level 3 is collected in the substrate denoted by a single bar representation in FIGS. 4a-4k and is communicated via coupling 804 to the level 2 logic as shown in FIG. 4c near transistor 28. Level 2 is comprised of approximately 175 gates and is denoted by a two bar reference potential symbol in FIGS. 4a-4k on the emitters of the I²L transistors. Level 2 is comprised essentially of the control circuitry 726, the digit driver circuitry 730, the one-our-of-four decode 724, and part of the countdown chain 718. Shown interconnecting level 2 and level 3 is diode 800 (representing D13-D18 in FIG. 4) above described for improving circuit performance.

The approximately 4 microamps current is collected in the level 2 substrate and communicated via coupling 805 (near transistor 126 in FIG. 4a) into the first high power level. Level 1 is comprised essentially of the higher speed flip-flops of the countdown chain, wherein the current is not shared equally by each flip-flop. Their geometries are designed such that the power is graded; that is, one flip-flop gets 1.6 microamps, the second gets 0.8 microamps, the third gets 0.4 microamps, the fourth gets 0.2 microamps, etc. due to decreasing geometries. This power grading is to maximize the speed power product, so that only the power needed to drive the flip-flop at its intended frequency is supplied thereto. For example, the 32 kilohertz oscillator 716 drives the first flip-flop in the countdown chain at 32 KHz which requires the most power. The second flip-flop is driven at 16 KHz which requires the next greatest amount of power, and the third flip-flop is driven at 8 kilohertz requiring the next greatest amount of power and so forth.

Referring now to FIGS. 5a and 5b, there is shown the specific series connected regulator 714/oscillator 716 combination herein utilized for providing a highly regulated and reliable timekeeping signal with a minimal system power consumption. The regulator circuit 714 is similar to applicant's regulator circuit disclosed in co-pending patent application Ser. No. 263,819, filed June 19, 1972, entitled "Regulator". A brief functional description gasec thereon is included for complete understanding of the regulator. Transistors 4-7 and 1-3 form current sources having common bases, the current drive through which is controlled by transistor 10. By tying several collectors together of transistors 5-7 to provide current I2, then current I1 is set to be several times smaller than current I2. Transistors 8 and 9 having common bases are configured to receive currents I1 and I2 such that the difference of their respective emitter currents generates a $V_{BE}$ voltage difference across R1. Therefore, by placing an appropriately valued reference resistor R1 between the emitters of transistors 8 and 9, then a controlable amount of regulated current is generated to the reference terminal. Current source transistors 1-3 are coupled such that the collector current of transistor 3 is dependent upon the current through resistor R1. By appropriately choosing geometries of transistors 1-3 or by connecting a proper number of collectors in a multi-collector transistor in common, then a regulated and predetermined amount of current flows from the commonly connected collectors of transistors 1 and 2 to the level 3 injectors via line 803. Appropriate geometries and parameters are chosen such that approximately 4 microamps are generated via line 803, and 2 microamps are generated to the oscillator 716 from the reference point formed by the common emitters of transistors 9, 410, 10 and 11 and resistor R1.

The regulator depicted in FIG. 5 is an improvement over the similar regulator disclosed in Ser. No. 263,819 in that reference resistor R1 is now formed as an integrated resistor instead of an external resistor, and transistor 410, 416 in combination with Schottky diodes D38 and D42 provide a self-starting circuit, contrary to the regulator disclosed in the copending case. Additional description of the general regulator function is incorporated by reference from Ser. No. 263,819 as needed.

The oscillator 716 depicted in FIG. 5 is an improved version of a Pierce oscillator having an input PNP transistor described in copending patent application Ser. No. 263,919 filed June 19, 1972 by Stanley W. Holcomb. The oscillator therein disclosed, however, received pulsed current from current source transistors and was self-power determining. The oscillator herein utilized receives a constant current from regulator 714 of approximately 2 microamps. A simplified oscillator circuit results in that additional bias stabilization feedback means are not required in that regulated current is received from regulator 714. Furthermore, because the oscillator is stacked in series with the regulator, instead of connected in parallel as in Ser. No. 263,919, additional system power consumption is not encountered, as the same 2 microamps generated in the regulator are utilized in the oscillator.

Oscillator 714 may generally be described as a crystal controlled Pierce oscillator having complementary transistors operating from constant current sources with the output taken from an emitter of one of the complementary transistors operating in an emitter follower configuration. Feedback to the control crystal is taken from the collector of the other of the complementary transistors. An output amplifier transistor of the same type as the other of the complementary transistors operates from another constant current source, i.e., source transistor 16. DC bias is provided by diode D34 and resistors R2 and R3 coupled to current divider transistors Q12-Q16. Feedback from the collector of Q19 through the diode D34 to the base of transistor Q20 provides stabilization by holding the collector voltage of transistor Q19 to a value which is slightly higher than the voltage drop across the D34/R3 series combination; that is, Q19 is not allowed to saturate. Driving the current source/current divider transistors Q12-Q16 is multi-emitter transistor Q17. It provides a diode reference through one of its emitters to circuit ground for referencing the base of transistors of Q12-Q16 one $V_{BE}$ above ground. Furthermore, transistor Q17 by means of its other emitter shown connected back to its base terminal raises transistors 18 and 19 approximately 100 millivolts higher above circuit ground. This is accomplished by using the collector emitter circuit of transistor Q17 as an offset voltage. When Q17 saturates, the base collector junction is forward biased which injects carriers into the emitters which are connected to the base. Although functionally depicted as a single emitter in FIG. 4, several emitters are provided and commonly connected. In this configuration, the seven emitters in combination with the collector acts like an inverted transistor and a beta clamp.

To properly DC bias the oscillator, the $V_{BE}$ in transistor Q19 must be larger than the VBE in transistor Q20 plus the IR drop to ground. As integrated injection logic requires a relatively low resistivity epilayer, such as 0.20 ohm-centimeters, and a high inverse gain of the NPN transistor, transistor pair 18 and 19 are desirously elevated some 100 milivolts above ground to allow proper DC biasing of transistor 20. This elevation is effected by transistor 17.

A brief functional description of the oscillator is as follows. Approximately 2 microamps is impressed upon current divider transistors 12-16 where it is divided into a three-one-one ratio. A DC bias is established on the base of emitter follower transistor 20 through diode D34 and resistors R2-R3 to circuit ground. As the voltage on the base of transistor Q20 varies in accordance with the externally connected crystal and trimmer capacitor, NPN transistor Q19 either conducts or is rendered nonconductive. When transistor Q19 is conductive, and its collector emitter path is coupled to circuit ground through the collector emitter path of transistor Q17, the base of transistor Q20 resides at a voltage greater than the base of transistor Q19 to circuit ground. However, when the voltage on the base of transistor Q20 drops more than one VBE below the voltage on the base of transistor Q19, the base drive from Q19 is conducted to circuit ground through Q20, and Q19 is rendered nonconductive. When Q20 is rendered conductive, output transistor Q18 is rendered nonconductive and a logic one is communicated to the I²L buffer. Conversely, when substrate PNP transistor 20 is rendered nonconductive, current divider transistor 16 provides base drive to output transistor 18 rendering it conductive for providing a logic zero to the I²L buffer. It is understood that multi-emitter transistor 20 may suitably be replaced with a pair of single emitter PNP transistors having common bases and common emitters for providing the output from the PNP transistor. Further understood is that current source transistors 12-16, which are actually used as current dividing transistors, may be provided in a single multi-collector transistor such that a three-to-one-to-one output ratio is provided.

Figure 6A:
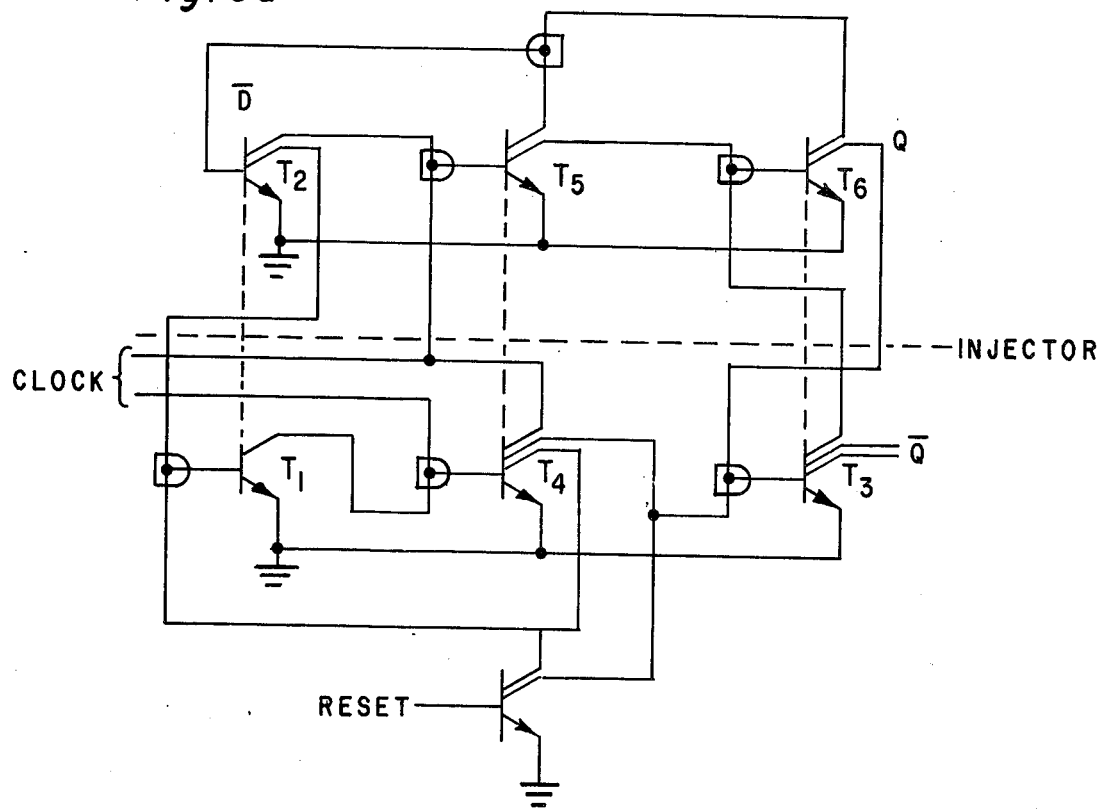
FIGS. 6a–6c depict the D type flip-flop implemented in I²L logic according to the invention.
Figure 6B:
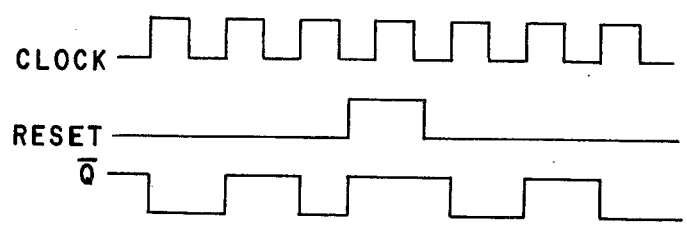
Figure 6C:
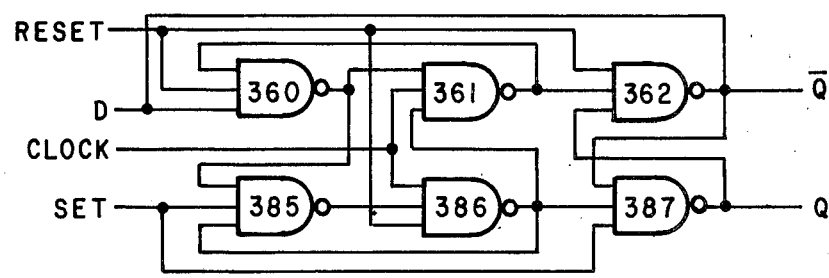

Referring now to FIGS. 6a-6c, there are depicted the D type toggle flip-flop implemented in I²L technology, a representative set of wave forms, and a conventional D flip-flop in logic form. The conventional D flip-flop is implemented having its $\overline{Q}$ output fed back to the D input, with a set terminal provided for setting the Q output high upon command. In integrated injection logic as is well known, a multi-collector I²L transistor may be utilized to provide a logic NAND gate, with I²L technology capable of accepting wired AND connections. Referring to FIG. 4, the D flip-flop comprising transistors 360-362, 382 and 384-387 implement an I²L D toggle flip-flop. The logic representation therefor is represented in FIG. 6c with the respective I²L transistor labeled which provided the appropriate NAND gate. It is noted that the input to gate 361 in FIG. 4 is a single wired AND function from the clock input, from the output of gate 386, and from the output gate 360.

FIG. 6a depicts a D toggle flip-flop implemented in I²L technology whereby the outputs and D inputs are inverted such that the Q output is fed back to a $\overline{D}$ input. Such a modification is advantageous in that the set and reset terminals also become inverted. As seen from FIG. 6c, three reset inputs to gates 360, 386 and 362 are required while only two set inputs to gates 385 and 387 are required. Therefore, when utilizing D flip-flops in a toggle mode as described in this watch system which require reset pulses, then only a two collector reset transistor such as transistors 127-130 is required. Referring to the counters in general and specifically counter 22a, it is seen that both types of D flip-flops are utilized, one having the $\overline{Q}$ output fed back to the D input requiring a three collector reset transistor, and a D flip-flop having the Q output fed back to a $\overline{D}$ input and having a two collector reset transistor. By eliminating the requirement for an additional collector on the reset transistor and the resulting metal interconnect, a more dense and less power consuming circuit is provided.

Circuit operation of the D flip-flop having outputs and D inputs and set and reset control functions inverted is as follows: Assuming initially upon power up that transistor T6 is conductive, base drive is removed from transistor T2 and transistor T3 through the associated wired AND gates. Assuming that the clock is low, then the base drive for transistors T4 and T5 is removed through their associated wired AND gate. Base drive for transistor T1 is provided by its associated wired AND gate as T2 is biased nonconductive. As transistors T1-T6 are implemented in integrated injection logic, as above discussed with respect to this specific watch circuitry, a transistor is inherently in the conductive mode unless the base drive has been removed therefrom by means of another device, such as a collector emitter path. The flip-flop in the state above described resides in a stable condition. Then, when the clock goes to a high logic state initially, base drive is provided for T5 as T2 is biased nonconductive. T5 conducts and removes base drive from transistor T6, and accordingly base drive is provided for transistor T3. When the clock subsequently goes low, base drive is removed from transistor T5, which in combination with the nonconductive state of transistor T6 provides base drive for transistor T2. The conduction of T2 removes base drive from T1 and T5. When the clock goes high for a second time, base drive is provided for transistor T4 which removes base drive from transistor T3. With transistor T2 and T5 being biased nonconductive, base drive is provided for transistor T6 which removes base drive from T2. When the clock goes low again, base drive is removed from T5 and with T4 and T2 biased nonconductive, base drive is provided for T1. This cycle continues as long as the clock is present unless a reset pulse occurs. A reset pulse results in the $\overline{Q}$ output being set to a high state. When the reset line goes high, base drive is provided for transistor T7 causing it to remove base drive from transistors T3 and T1. With transistor T3 being biased nonconductive, the $\overline{Q}$ output is rendered high.

Figure 7A:
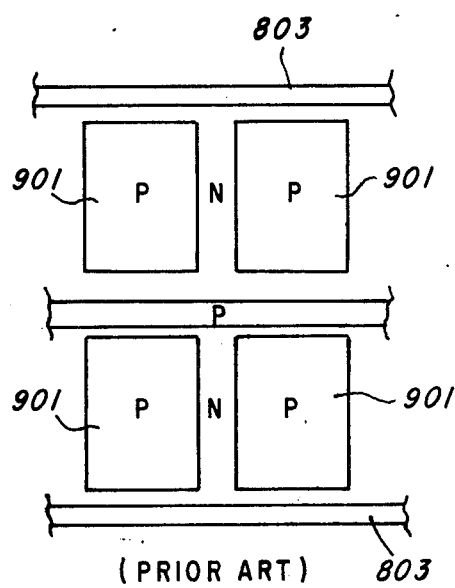
FIGS. 7a and 7b depict the I²L logic of this invention utilizing graded power and controlled injector/geometries.
Figure 7B:
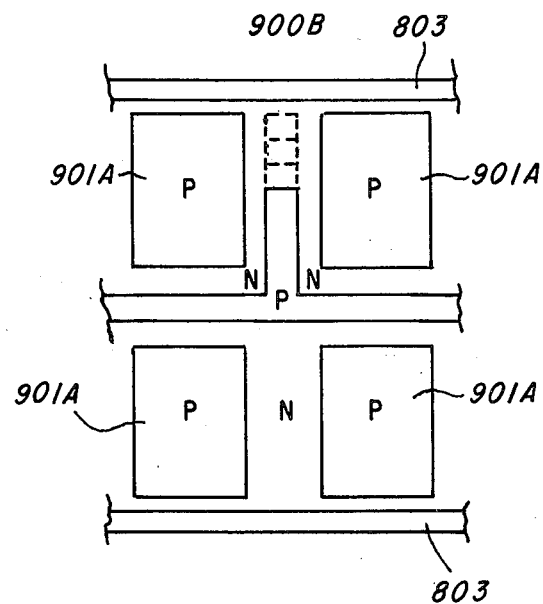

With reference now to FIGS. 7a and 7b, there is shown plan views of geometry representations of a prior art integrated injection logic cell and an integrated injection cell featuring graded power in accordance with this invention. That is, as disclosed in above mentioned article Integrated Injection Logic, *A New Approach to LSI* by Hart et al, 1972, *IEEE ISSSCC*, page 93, FIG. 3, one technique for configuring the specific I²L cell is to provide the emitter region of the lateral PNP transistor as an elongated strip for use as a common injector for all cells. P type regions 901 provide the collectors for the lateral transistor and further provide the bases of the vertical NPN transistors (referring to FIG. 2a). Utilizing such an arrangement it is easily seen that each of the P type regions 901 receive an equal amount of injector drive current from emitter strip 900. However, it is often desirable to provide different amounts of drive to selected I²L transistors in that although substantial power savings is effected by the choice of I²L logic, an even greater power savings is effected by power grading for optimizing speed/power products.

FIG. 7b, therefore, discloses an elongated emitter injector strip 900a having geometry 900b extending in a transverse direction from the elongated strip so as to selectively provide more injector drive into various I²L transistors. For example, the part 900b of the injector extending in a transverse direction from strip 900a is selected as to length and width so as to provide an appropriate emitter periphery and area to control the amount of injected current into P type regions 901a.

As earlier discussed in this application, various flip-flops in the countdown chain receive a different amount of power so that an optimum speed/power product is realized. That is, flip-flops in the countdown chain successively operate at a frequency reduced by a factor of two from the previous frequency and each flip-flop accordingly requires less power. By utilizing such a varying injector geometry technique as disclosed in FIG. 7b, an optimum speed/power ratio is realizable.

It will be appreciated that a bipolar electronic watch has been provided implemented in bipolar integrated injection logic. As the requisite system speed, power consumption is minimal, and as little as 6 microamps is required to drive the timing circuitry. Further, power savings is effected by grading the power supplied to the countdown chain in that the geometries of the emitter of the injector transistor are varied such that flip-flops operating at a higher frequency receive more injection current. Still further, power savings is effected by coupling the oscillator which provides the system clock in series with the regulator such that current utilized by the regulator in generating its regulated output is reconsumed by the oscillator. Therefore, overall system power consumption is reduced. The electronic circuitry of the system is partitioned into a plurality of electronic levels which are series interconnected by a diode. Accordingly, each logic level uses the same amount of current and further reduces system power consumption. The diode connecting the logic levels reduces the voltage swing of the transistor interfacing the interconnected logic level and therefore reduces switching time and improves circuit performance. Application of a D toggle flip-flop having its outputs inverted and its D input inverted allows an I²L implementation which eliminates one transistor or one collector of a multi-collector transistor over a conventional D toggle flip-flop configuration. To reduce logic circuitry otherwise required, asynchronous counters are used for the seconds, minutes and hours counters, and the output of each respective counter is used as a gating input for gating the 1 Hertz system clock into the next counter.

While various embodiments have been described in detail herein of an I²L electronic wristwatch, various changes will be apparent to those skilled in the art without departing from the spirit or scope of the invention.

What is claimed is:
1. A digital electronic watch comprising:
  (a) a housing;
  (b) display means contained within said housing and being visible from the exterior of said housing;
  (c) electronic timekeeping circuitry contained within said housing and responsive to a reference frequency signal for generating electrical signals indicative of timekeeping functions, said display means being coupled to said timekeeping circuitry and responsive to said electrical signals for displaying said timekeeping functions;

(d) battery receiving means for receiving battery means to power said electronic timekeeping circuitry; and (e) said electronic timekeeping circuitry being in the form of a monolithic semiconductor integrated circuit having first and second terminals coupled to said battery receiving means and arranged in at least first and second logic levels with each of said logic levels having at least one logic input and at least one logic output and being comprised of:

(i) a plurality of interconnected logic elements with each of said logic elements being comprised of semiconductor devices and having first and second power electrodes for energization thereof;

(ii) first means electrically coupling the first power electrodes of the logic elements of said first level in common to said first terminal;

(iii) second means electrically coupling the second power electrodes of the logic elements of said second level in common to said second terminal;

(iv) third means electrically coupling the second electrodes of the logic elements of said first level in common to the first electrodes of the logic elements of the second level; and (v) a PN junction device coupling the at least one logic output of said first level to the at least one logic input of said second level.

2. The electronic timepiece according to claim 1, wherein said first logic level includes a countdown chain of flip-flop devices responsive to said reference frequency signal, and said second logic level includes a plurality of counters logically coupled to said first level for generating said electrical signals indicative of timekeeping functions.

3. The electronic timepiece according to claim 2, wherein said first level further includes control circuitry for controlling said electronic timekeeping circuitry.

4. The electronic timepiece according to claim 2, wherein said first means includes one or more additional logic levels in cascade coupled between the commonly-coupled first power electrodes of the logic elements of said first level and said first terminal.

5. The electronic timepiece according to claim 4, wherein a third level is comprised of a frequency divider logically coupling said countdown chain to said reference frequency signal.

6. The electronic timepiece according to claim 2, wherein said second level includes a decoder circuit coupling said counters to said display means for decoding the outputs of said counters to display format.

7. The electronic watch according to claim 1, wherein each of said logic elements is comprised of at least one pair of transistors, each pair including a vertical NPN transistor and a lateral PNP transistor, said lateral PNP transistor being coupled between the first and second power electrodes of the element and to the base of the NPN transistor of the pair for providing base injection drive into such NPN transistor.

8. The electronic timepiece according to claim 7, wherein said PN junction device couples the collector of an NPN transistor of a logic element of said first level to the base of an NPN transistor of a logic element of said second level.

9. The electronic timepiece according to claim 8, wherein the P-type region of said PN junction device is connected to the base of the NPN transistor of the logic element of said second level, and the N-type region of said PN junction device is connected to the collector of the NPN transistor of the logic element of said first level.

10. The electronic timepiece according to claim 7, wherein the base of each of said PNP transistors is coupled to the first power electrode of the respective logic element, the emitter of each of said PNP transistors is coupled to the second power electrode of the respective logic element and the collector of each of said PNP transistors is coupled to the base of the NPN transistor of the pair.

11. The electronic timepiece according to claim 1, wherein said second means includes a constant regulator coupling the second power electrodes of the logic elements of said second level in common to said second terminal.

* * * * *